(12) United States Patent
Suemitsu et al.

(10) Patent No.: US 12,339,334 B2
(45) Date of Patent: Jun. 24, 2025

(54) MAGNETORESISTIVE ELEMENT AND SEMICONDUCTOR DEVICE

(71) Applicant: SONY SEMICONDUCTOR SOLUTIONS CORPORATION, Kanagawa (JP)

(72) Inventors: Katsumi Suemitsu, Yamagata (JP); Makoto Ueki, Yamagata (JP); Masashige Moritoki, Yamagata (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 1062 days.

(21) Appl. No.: 17/287,587

(22) PCT Filed: Oct. 30, 2019

(86) PCT No.: PCT/JP2019/042536
§ 371 (c)(1),
(2) Date: Apr. 22, 2021

(87) PCT Pub. No.: WO2020/095785
PCT Pub. Date: May 14, 2020

(65) Prior Publication Data
US 2021/0389395 A1 Dec. 16, 2021

(30) Foreign Application Priority Data
Nov. 7, 2018 (JP) .................. 2018-209332

(51) Int. Cl.
*H10N 50/10* (2023.01)
*G01R 33/09* (2006.01)
(Continued)

(52) U.S. Cl.
CPC .......... *G01R 33/093* (2013.01); *G11C 11/161* (2013.01); *H10N 50/10* (2023.02); *H10N 50/80* (2023.02); *H10N 50/85* (2023.02)

(58) Field of Classification Search
CPC .. H10B 61/00–22; H10N 60/10; H10N 60/80; H10N 60/85
See application file for complete search history.

(56) References Cited

U.S. PATENT DOCUMENTS

2002/0025592 A1 2/2002 Schindler
2003/0234412 A1 12/2003 Yamanobe
(Continued)

FOREIGN PATENT DOCUMENTS

EP 1182698 A2 2/2002
JP 2002-076296 3/2002
(Continued)

OTHER PUBLICATIONS

International Search Report prepared by the Japan Patent Office on Jan. 14, 2020, for International Application No. PCT/JP2019/042536.

*Primary Examiner* — Tucker J Wright
(74) *Attorney, Agent, or Firm* — Sheridan Ross PC

(57) ABSTRACT

A magnetoresistive element of the present disclosure includes a multilayer structure made up of at least a fixed magnetization layer, an intermediate layer and a storage layer. A first side wall is formed on a side wall of the multilayer structure. A second side wall is formed on the first side wall. The first side wall is made of an insulating material, for instance SiN or AlOx, that prevents intrusion of hydrogen. The second side wall is made of a hydrogen storage material, for instance titanium.

11 Claims, 25 Drawing Sheets

(51) Int. Cl.
  *G11C 11/16* (2006.01)
  *H10N 50/80* (2023.01)
  *H10N 50/85* (2023.01)

(56) References Cited

U.S. PATENT DOCUMENTS

| | | | |
|---|---|---|---|
| 2004/0188742 | A1 | 9/2004 | Honma et al. |
| 2014/0070162 | A1 | 3/2014 | Iwayama |
| 2016/0315091 | A1* | 10/2016 | Okuyama ............. H01L 23/522 |
| 2021/0273002 | A1* | 9/2021 | Shimizu ............ H01L 27/14634 |

FOREIGN PATENT DOCUMENTS

| | | |
|---|---|---|
| JP | 2004-031553 | 1/2004 |
| JP | 2004-186353 | 7/2004 |
| JP | 2006-253303 | 9/2006 |
| JP | 2007-027537 | 2/2007 |
| JP | 2007-134736 | 5/2007 |
| JP | 2013-008868 | 1/2013 |
| JP | 2014-056941 | 3/2014 |

* cited by examiner

MAGNETORESISTIVE ELEMENT AND SEMICONDUCTOR DEVICE

CROSS REFERENCE TO RELATED APPLICATIONS

This application is a national stage application under 35 U.S.C. 371 and claims the benefit of PCT Application No. PCT/JP2019/042536 having an international filing date of 30 Oct. 2019, which designated the United States, which PCT application claimed the benefit of Japanese Patent Application No. 2018-209332, filed 7 Nov. 2018, the entire disclosures of each of which are incorporated herein by reference.

TECHNICAL FIELD

The present disclosure relates to a magnetoresistive element, and to a semiconductor device provided with that magnetoresistive element.

BACKGROUND ART

In MRAMs (magnetic random access memories) data is stored on the basis of the magnetization direction of a magnetic material; MRAMs allow therefore for fast and substantially limitless rewriting ($10^{15}$ times or more), and are already in use in fields such as industrial automation and aerospace. By virtue of to their high-speed operation and high reliability, MRAMs are expected to expand into code storage and working memories in the future; in actuality, this is however problematic in terms of lowering power consumption and increasing capacity. These are essential problems derived from the recording principle of MRAMs, namely a method for reversing magnetization using a current magnetic field generated from wiring. Recording methods that do not rely on a current magnetic field, i.e. magnetization reversal methods, have been studied as one instance of methods for solving this problem. Among the foregoing, magnetoresistive elements made up of a spin injection-type magnetoresistive effect element (STT-MRAM, Spin Transfer Torque based Magnetic Random Access Memory) that exploits magnetization reversal by spin injection have drawn attention (see for instance JP 2013-008868 A).

Magnetization reversal by spin injection is a phenomenon whereby electrons that have become spin-polarized by passing through a magnetic material are injected into another magnetic material, thereby eliciting magnetization reversal in the other magnetic material. Relying on magnetization reversal by spin injection, in a magnetoresistive element made up of a spin injection-type magnetoresistive effect element is advantageous in that write currents do not increase even as the element becomes finer, as compared with MRAMs in which magnetization is reversed on the basis of an external magnetic field; is advantageous in that scaling is enabled since write current values decrease in proportion to element volume; is advantageous in that cell surface area can be reduced; and is further advantageous in that device structure and cell structure are simplified, since word lines for generating a recording current magnetic field, which are required in MRAMs, are however not necessary herein. Magnetoresistive elements made up of spin injection-type magnetoresistive effect elements have for instance a multilayer structure made up of a fixed magnetization layer, an intermediate layer and a storage layer.

CITATION LIST

Patent Literature

[PTL 1]
JP 2013-008868 A
[PTL 2]
JP 2007-027537 A

SUMMARY

Technical Problem

In a production process of such magnetoresistive elements made up of a spin injection-type magnetoresistive effect element, the multilayer structure of the magnetoresistive element comes often in contact, during the processing process, with hydrogen generated in an interlayer insulating layer or the like. Various problems arise as a result in that for instance the various layers that make up the multilayer structure of the magnetoresistive element become reduced, the information retention characteristic of the magnetoresistive element degrades, and resistance values exhibit variability. Semiconductor storage devices having at least one layer of a reaction inhibiting film composed of a material having an action of blocking the permeation of reducing species that promote reduction reactions and oxidizing species that promote oxidation reactions, in a variable resistor, are known devices, being disclosed in JP 2007-027537A. Ordinarily, semiconductor devices are provided not only with a semiconductor storage device but also with a peripheral circuit portion. Although it is not preferable to provide a reaction inhibiting film in the peripheral circuit portion in order to improve the characteristics of the peripheral circuit portion, this fact is not mentioned at all in JP 2007-027537 A.

Therefore, it is an object of the present invention to provide a magnetoresistive element having stable characteristics, and to provide a semiconductor device that affords yet better characteristics.

Solution to Problem

A magnetoresistive element according to a first aspect of the present disclosure for attaining the above goal has a multilayer structure made up of at least a fixed magnetization layer, an intermediate layer and a storage layer;
  wherein a first side wall is formed on a side wall of the multilayer structure; a second side wall is formed on the first side wall;
  the first side wall is made of an insulating material that prevents intrusion of hydrogen; and
  the second side wall is made of a hydrogen storage material.

A magnetoresistive element according to a second aspect of the present disclosure for attaining the above goal has a multilayer structure made up of at least a fixed magnetization layer, an intermediate layer and a storage layer;
  wherein the multilayer structure further has an upper hydrogen storage layer thereon or thereabove.

A magnetoresistive element according to a third aspect of the present disclosure for attaining the above goal has a multilayer structure made up of at least a fixed magnetization layer, an intermediate layer and a storage layer;
  wherein the multilayer structure further has a lower hydrogen storage layer thereunder or therebelow.

A magnetoresistive element according to a fourth aspect of the present disclosure for attaining the above goal has a multilayer structure made up of at least a fixed magnetization layer, an intermediate layer and a storage layer;

wherein the multilayer structure is surrounded by a hydrogen intrusion preventing layer made of an insulating material.

A magnetoresistive element according to a fifth aspect of the present disclosure for attaining the above goal has a multilayer structure made up of at least a fixed magnetization layer, an intermediate layer and a storage layer;

wherein the multilayer structure is covered by an upper insulating layer; and an upper interlayer film made of a hydrogen storage material is formed within a region of the upper insulating layer positioned outward of the multilayer structure.

A magnetoresistive element according to a sixth aspect of the present disclosure for attaining the above goal has a multilayer structure made up of at least a fixed magnetization layer, an intermediate layer and a storage layer;

wherein the multilayer structure is formed on an insulating layer; and a lower interlayer film made of a hydrogen storage material is formed within a region of the insulating layer positioned outward of the multilayer structure.

A semiconductor device according to a first aspect of the present disclosure for attaining the above goal is provided with a magnetoresistive element array portion made up of a magnetoresistive element, and a peripheral circuit portion, wherein the magnetoresistive element has a multilayer structure made up of at least a fixed magnetization layer, an intermediate layer and a storage layer; the magnetoresistive element array portion and the peripheral circuit portion are covered by an upper insulating layer;

an upper interlayer film made of a hydrogen storage material is formed within the upper insulating layer in the magnetoresistive element array portion; and the upper interlayer film is not formed in the peripheral circuit portion.

A semiconductor device according to a second aspect of the present disclosure for attaining the above goal is provided with a magnetoresistive element array portion made up of a magnetoresistive element, and a peripheral circuit portion, wherein the magnetoresistive element has a multilayer structure made up of at least a fixed magnetization layer, an intermediate layer and a storage layer; and the multilayer structure is surrounded by a hydrogen intrusion preventing layer that is made of an insulating material and is shared by magnetoresistive elements.

DESCRIPTION OF EMBODIMENTS

Figure 1:
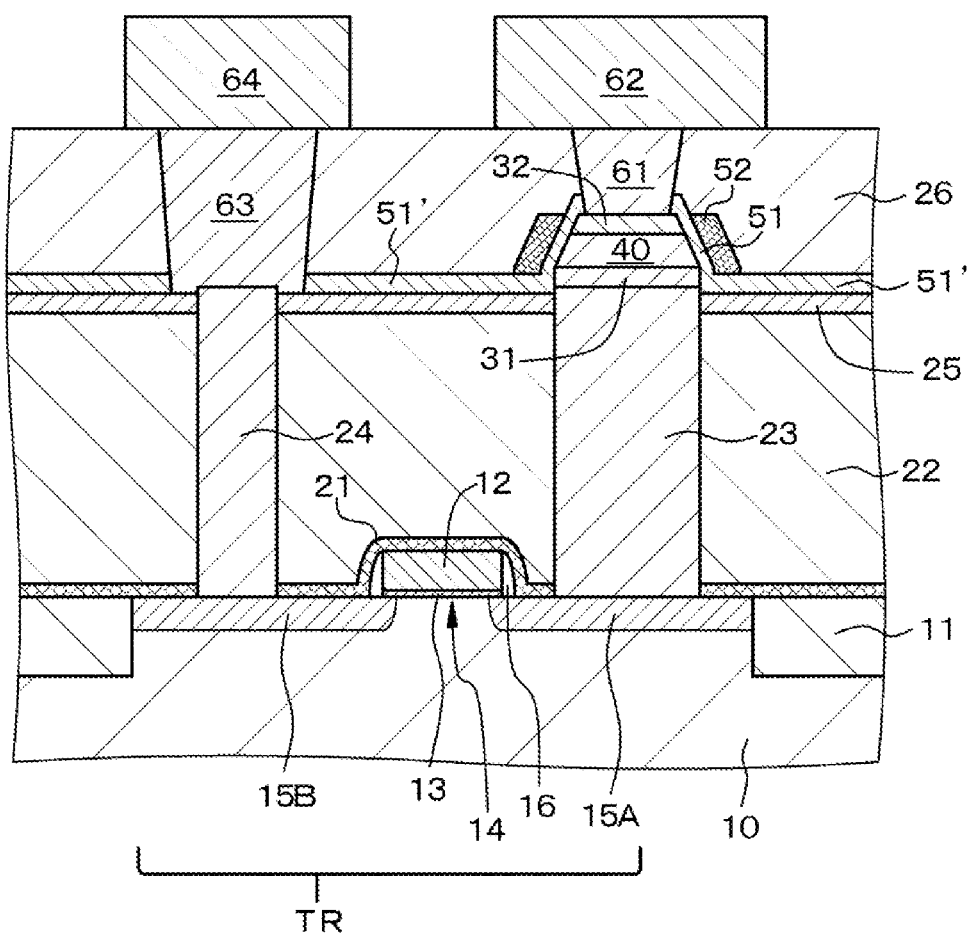
FIG. 1 is a schematic partial cross-sectional diagram of a magnetoresistive element of Embodiment 1.

The present disclosure will be explained hereafter on the basis of embodiments, with reference to accompanying drawings; however, the present disclosure is not limited to the embodiments below, and the various numerical values and materials in the embodiments are illustrative. The explanation will follow the order below.
1. General explanation of the magnetoresistive element according to a first aspect through fourth aspect of the present disclosure, and a semiconductor device according to a first aspect and second aspect of the present disclosure
2. Embodiment 1 (magnetoresistive element according to a first aspect of the present disclosure)
3. Embodiment 2 (variation of Embodiment 1)
4. Embodiment 3 (magnetoresistive element according to a second aspect and third aspect of the present disclosure)
5. Embodiment 4 (variation of Embodiment 1 to Embodiment 3)
6. Embodiment 5 (magnetoresistive element according to a fourth aspect of the present disclosure)
7. Embodiment 6 (semiconductor device according to a first aspect of the present disclosure)
8. Embodiment 7 (semiconductor device according to a second aspect of the present disclosure)
9. Embodiment 8 (application example of magnetoresistive elements of Embodiment 1 to Embodiment 5)
10. Others <General Explanation of a Magnetoresistive Element According to a First Aspect Through Fourth Aspect of the Present Disclosure, and a Semiconductor Device According to a First Aspect and Second Aspect of the Present Disclosure>

In the magnetoresistive element according to a first aspect of the present disclosure a second side wall can be made of titanium (Ti). In that case the thickness of the second side wall can be $2 \times 10^{-8}$ m or larger, preferably $3 \times 10^{-8}$ m or larger. The upper limit of the thickness of the second side wall may be $1 \times 10^{-7}$ m; more preferably, the thickness of the second side wall lies in the range of not less than $3 \times 10^{-8}$ m and not more than $6 \times 10^{-8}$ m. The thickness of the second side wall is herein the thickness of a bottom portion of the second side wall.

In a magnetoresistive element according to a first aspect of the present disclosure including the above preferred form, the first side wall can be made of SiN or $AlO_X$. In this case the thickness of the first side wall can be $1 \times 10^{-8}$ m or larger. The upper limit of the thickness of the first side wall can be for instance $5 \times 10^{-8}$ m. The thickness of the first side wall is herein the thickness of a bottom portion of the first side wall.

The inclination angle of the first side wall is not particularly limited, but is preferably in the range of 45 degrees to 60 degrees, from the viewpoint of ensuring uniformity of film quality of the second side wall that is formed on the first side wall.

In the magnetoresistive element according to a first aspect of the present disclosure including the various preferred forms explained above, a form can be adopted where a third side wall made of an insulating material that prevents intrusion of hydrogen is formed on the second side wall. In this case a form can be adopted where third side wall is made of SiN or $AlO_X$.

In a case where the first side wall and the third side wall are made of SiN, preferably the film quality of the SiN that constitutes the third side wall is higher than the film quality of the SiN that constitutes the first side wall. Whether or not the film quality of SiN is superior can be evaluated on the basis of the hydrogen content of SiN; herein it is considered that the lower the hydrogen content, the higher the film quality of SiN is. Specifically, infrared spectroscopy may be performed and the proportion of the Si—H spectrum peak with respect to Si—N spectrum peak be worked out, such that if a proportion $P_3$ of the spectrum peak of SiN that constitutes the third side wall is lower than a proportion $P_1$ of the spectrum peak of SiN that constitutes the first side wall, it is considered that the film quality of the SiN that constitutes the third side wall is higher. As an example, the value of $P_3$ can be for instance 0.04 or less. The value of $P_1$ may be 0.04 or less, or may be a value in excess of 0.04.

In some cases the second side wall may be not formed, and the third side wall may be formed on the first side wall. In that case as well, preferably the film quality of the SiN that constitutes the third side wall is higher than the film quality of the SiN that constitutes the first side wall, as described above.

In the magnetoresistive element according to a first aspect of the present disclosure including the various preferred forms explained above, a form can be adopted where
    the multilayer structure further has an upper hydrogen storage layer thereon or thereabove, and
    the first side wall covers a side wall of the upper hydrogen storage layer.

In the magnetoresistive element according to a first aspect of the present disclosure including the various preferred forms explained above, a form can be adopted where
    the multilayer structure further has a lower hydrogen storage layer thereunder or therebelow, and
    the first side wall covers a side wall of the lower hydrogen storage layer. In that case,
    the lower hydrogen storage layer is formed on a base portion, and the first side wall covers a side wall of the base portion. In such a structure a bottom face of the lower hydrogen storage layer is positioned above the bottom face of the first side wall.

In the magnetoresistive element according to a first aspect of the present disclosure including the various preferred forms explained above, a form can be adopted where
    it is a covered by the upper insulating layer, and
    an upper interlayer film made of a hydrogen storage material is formed within the upper insulating layer.

In the magnetoresistive element according to a first aspect of the present disclosure including the various preferred forms explained above, a form can be adopted where
    the multilayer structure is formed on an interlayer insulating layer, and
    a lower interlayer film made of a hydrogen storage material is formed within the interlayer insulating layer.

A form can be adopted in which the thickness of the upper interlayer film or lower interlayer film is $1 \times 10^{-8}$ m or larger, preferably $2 \times 10^{-8}$ m or larger, as a result of which an upper interlayer film or lower interlayer film, having a desired volume can be obtained.

Examples of the material that constitutes the upper hydrogen storage layer include titanium (Ti). The same is true of the magnetoresistive element according to a second aspect of the present disclosure. Examples of the material that constitutes the lower hydrogen storage layer include titanium (Ti). The same is true of the magnetoresistive element according to a third aspect of the present disclosure. Examples of the material that constitutes the upper interlayer film or the lower interlayer film include titanium (Ti). In the magnetoresistive element according to a first aspect of the present disclosure including the various preferred forms explained above, a form can be adopted where the multilayer structure is formed on a base portion, and the first side wall covers a side wall of the base portion. In such a structure a bottom face of the multilayer structure is positioned above the bottom face of the first side wall.

In a magnetoresistive element according to a second aspect of the present disclosure a form can be adopted where the multilayer structure further has a lower hydrogen storage layer thereunder or therebelow.

In the magnetoresistive element according to a fourth aspect of the present disclosure, or the semiconductor device according to a second aspect of the present disclosure, a form can be adopted where a hydrogen intrusion preventing layer is made of SiN or $AlO_X$. In a case where the hydrogen intrusion preventing layer is made of SiN, preferably the hydrogen intrusion preventing layer has film quality of SiN that constitutes the above-described third side wall. In some cases, the hydrogen intrusion preventing layer of the magnetoresistive element according to the fourth aspect of the present disclosure can be used also in the magnetoresistive element according to a first aspect through third aspect of the present disclosure. In the semiconductor device according to a second aspect of the present disclosure a form can be adopted where a hydrogen intrusion preventing layer is formed in a magnetoresistive element array portion, and a hydrogen intrusion preventing layer is not formed in a peripheral circuit portion.

In the semiconductor device according to the first aspect of the present disclosure, a form can be adopted where the magnetoresistive element array portion is surrounded by a layer made of a hydrogen storage material (specifically for instance titanium).

In the magnetoresistive element according to the first aspect through fourth aspect of the present disclosure including the various preferred forms explained above, or in the magnetoresistive element that makes up the semiconductor device according to the first aspect through second aspect of the present disclosure including the various preferred forms explained above (these magnetoresistive elements will be referred to collectively hereafter as "magnetoresistive element etc. of the present disclosure"), a form can be adopted where the metal atoms that make up the fixed magnetization layer and the storage layer include cobalt (Co) atoms, or iron (Fe) atoms, or cobalt atoms and iron atoms (Co—Fe). In other words, a form can be adopted where the metal atoms that make up the fixed magnetization layer and the storage layer include at least cobalt (Co) atoms or iron (Fe) atoms. Specifically, a form can be adopted where the fixed magnetization layer and the storage layer are composed of a metallic material (alloy or compound) made up of at least cobalt (Co) or iron (Fe).

Alternatively, in the magnetoresistive element etc. of the present disclosure a form can be adopted where the storage layer is made up of at least one type of metallic material (alloy or compound) selected from the group consisting of cobalt iron and nickel; preferably the storage layer is configured out of a metallic material (alloy or compound) made of cobalt, iron and nickel; alternatively; the storage layer is made of a metallic material (alloy, compound) made of cobalt, iron nickel and boron. Alternatively, examples of the material that constitutes the storage layer include alloys of ferromagnetic materials such as nickel (Ni), iron (Fe) or cobalt (Co) (for instance Co—Fe, Co—Fe—B, Co—Fe—Ni, Fe—Pt, Ni—Fe, Fe—B, Co—B or the like), and alloys resulting from adding gadolinium (Gd) to the foregoing alloys. In perpendicular magnetization types, for the purpose of further increasing perpendicular magnetic anisotropy, a heavy rare earth such as terbium (Tb), dysprosium (Dy) or holmium (Ho) may be added to such alloys, or alloys containing the foregoing heavy rare earths may be laid up on each other. The crystallinity of the storage layer is essentially arbitrary, and the storage layer may be polycrystalline, or may be a single crystal, or may be amorphous. The storage layer may have a single layer build-up, or may have a multilayer structure in which multiple different ferromagnetic material layers described above are laid up on each other, or a multilayer structure in which ferromagnetic material layers and non-magnetic material layers are laid up on each other.

A non-magnetic element may be added to the materials that make up the storage layer. By adding a non-magnetic element, effects are elicited of improving heat resistance and increasing the magnetoresistive effect, by preventing diffusion, as well as increasing of dielectric strength accompanying planarization. Non-magnetic elements that are added include B, C, N, O, F, Li, Mg, Si, P, Ti, V, Cr, Mn, Ni, Cu, Ge, Nb, Ru, Rh, Pd, Ag, Ta, Ir, Pt, Au, Zr, Hf, W, Mo, Re and Os.

Ferromagnetic material layers of dissimilar composition may be laid up as the storage layer. Alternatively, a ferromagnetic material layer and a soft magnetic material layer may be laid up on each other, or a plurality of ferromagnetic material layers may be laid up across interposed soft magnetic material layers or non-magnetic material layers. In a case in particular where multiple ferromagnetic material layers such a Fe layer, a Co layer, a Fe—Ni alloy layer, a Co—Fe alloy layer, a Co—Fe—B alloy layer, a Fe—B alloy layer or a Co—B alloy layer are laid up on each other across an interposed non-magnetic material layer, a relationship between magnetic strengths of the ferromagnetic material layers can be adjusted; as a result, it becomes possible to preclude large magnetization reversal currents in the spin injection-type magnetoresistive effect element, Examples of the material of the non-magnetic material layer include Ru, Os, Re, Ir, Au, Ag, Cu, Al, Bi, Si, B, C, Cr, Ta, Pd, Pt, Zr, Hf, W, Mo, Nb and V, and alloys of the foregoing.

Examples of the thickness of the storage layer include a range of 0.5 nm to 30 nm, and examples of the thickness of the fixed magnetization layer include a range of 0.5 nm to 30 nm.

A fixed magnetization layer can be embodied by having a multilayer ferrimagnetic structure (also referred to as a multilayer ferrimagnetic pinned structure) being a stack of at least two magnetic material layers. Specifically, a multilayer ferrimagnetic structure denotes a multilayer structure having antiferromagnetic coupling, i.e. a structure in which interlayer exchange coupling of two magnetic material layers (reference layer and fixed layer) is antiferromagnetic, also called synthetic antiferromagnetic coupling (SAF: synthetic antiferromagnet), such that interlayer exchange coupling between the two magnetic material layers is antiferromagnetic or ferromagnetic depending on the thickness of a non-magnetic layer that is provided between the two magnetic material layers (where one of the magnetic material layers may be referred to as "reference layer", and the other magnetic material layer that constitutes the multilayer ferrimagnetic structure may be referred to as "fixed layer"), as reported for instance in S. S. Parkin et al., Physical Review Letters, 7 May, pp 2304-2307 (1990). The magnetization direction of the reference layer is the magnetization direction serving as a reference for information to be stored in the storage layer. One of the magnetic material layers (reference layer) that constitute the multilayer ferrimagnetic structure is positioned on the side of the storage layer. That is, the reference layer is in contact with the intermediate layer. In this case, one of the magnetic material layers that constitutes the multilayer ferrimagnetic structure (for instance the reference layer) contains at least one element selected from the group consisting of iron (Fe), cobalt (Co) and nickel (Ni), or contains at least one element selected from the group consisting of iron (Fe), cobalt (Co) and nickel (Ni), and boron (B), and may be specifically a Co—Fe alloy, a Co—Fe—Ni alloy, a Ni—Fe alloy or a Co—Fe—B alloy, and may have a multilayer structure such as a Fe layer/Pt layer, a Fe layer/Pd layer, a Co layer/Pt layer, a Co layer/Pd layer, a Co layer/Ni layer, or a Co layer/Rh layer, so that magnetic characteristics can be adjusted through addition, to the foregoing materials, of a non-magnetic element such as Ag, Cu, Au, Al, Si, Bi, Ta, B, C, O, N, Pd, Pt, Zr, Ta, Hf, Ir, W, Mo, Nb, V, Ru or Rh, to adjust various physical properties such as crystal structure, crystallinity and substance stability; the other magnetic material layer (for instance fixed layer) that makes up the multilayer ferrimagnetic structure can be embodied in a form made up of a material that has, as main components, at least one element (referred to as "Element A" for convenience), selected from the group consisting of iron (Fe), cobalt (Co), nickel (Ni) and manganese (Mn), and at least one element (different from Element A, and referred to as "Element B" for convenience) selected from the group consisting of platinum (Pt), palladium (Pd), nickel (Ni), iridium (Ir) and rhodium (Rh). Examples of the material that constitutes the non-magnetic layer include ruthenium (Ru) and alloys thereof, and ruthenium compounds, and alternatively Os, Re, Ir, Au, Ag, Cu, Al, Bi, Si, B, C, Cr, Ta, Pd, Pt, Zr, Hf, W, Mo, Nb, V and Rh, as well as alloys of the foregoing. By imparting a multilayer ferrimagnetic structure to the fixed magnetization layer it becomes possible to reliably cancel thermal stability asymmetry in the information writing direction, and to enhance stability towards spin torque. Alternatively, the fixed layer may be configured out of a Co thin film/Pt thin film multilayer structure, and the reference layer may be in the form of a Co thin film/Pt thin film/CoFeB thin film multilayer structure (where the CoFeB thin film is in contact with the intermediate layer), with a non-magnetic layer for instance made of Ru disposed between the fixed layer and the reference layer, for the purpose of increasing an MR ratio.

The magnetization orientation of the fixed magnetization layer can be fixed by a ferromagnetic layer alone, or by exploiting antiferromagnetic coupling between an antiferromagnetic layer and a ferromagnetic layer. Specific examples of antiferromagnetic materials include Fe—Mn alloys, Fe—Pt alloys, Ni—Mn alloys, Pt—Mn alloys, Pt—Cr—Mn alloys, Ir—Mn alloys, Rh—Mn alloys, Co—Pt alloys, cobalt oxide, nickel oxide (NiO) and iron oxide ($Fe_2O_3$). Alternatively, magnetic characteristics can be adjusted through addition, to the foregoing materials, of a non-magnetic element such as Ag, Cu, Au, Al, Si, Bi, Ta, B, C, O, N, Pd, Pt, Zr, Ta, Hf, Ir, W, Mo, Nb, V, Ru or Rh, to adjust various physical properties such as crystal structure, crystallinity and substance stability; examples of the material that constitutes the non-magnetic layer include ruthenium (Ru) and alloys thereof, and ruthenium compounds, and alternatively Os, Re, Jr, Au, Ag, Cu, Al, Bi, Si, B, C, Cr, Ta, Pd, Pt, Zr, Hf, W, Mo, Nb, V and Rh, as well as alloys of the foregoing.

The fixed magnetization layer is not limited to a form having a multilayer ferrimagnetic structure. The fixed magnetization layer may be made up of one layer, and be set to function as a reference layer. Examples of materials that make up such a fixed magnetization layer include materials (ferromagnetic materials) that make up the below-described storage layer; alternatively, the fixed magnetization layer (reference layer) can be made up of a stack of a Co layer and a Pt layer, a stack of a Co layer and a Pd layer, a stack of a Co layer and a Ni layer, a stack of a Co layer and a Tb layer, or can be made up of a Co—Pt alloy layer, a Co—Pd alloy layer, a Co—Ni alloy layer, a Co—Fe alloy layer, a Co—Tb alloy layer, a Co layer, a Fe layer, or a Co—Fe—B alloy layer; and alternatively, magnetic characteristics can be adjusted through addition, to the foregoing materials, of a non-magnetic element such as Ag, Cu, Au, Al, Si, Bi, Ta, B, C, O, N, Pd, Pt, Zr, Hf, Ir, W, Mo, Nb, V, Ru or Rh, to adjust various physical properties such as crystal structure, crystallinity and substance stability. More preferably, the fixed magnetization layer (reference layer) can be made up of a Co—Fe—B alloy layer.

Given that the magnetization direction of the fixed magnetization layer constitutes a reference for information, the magnetization direction must not change as a result of recording or reading of information, but need not necessarily be fixed to a specific direction, and coercivity may be set to be larger than that of the storage layer, or the thickness may be increased, or a magnetic damping constant may be increased, or a configuration or structure may be adopted in which the magnetization direction changes less readily than in the storage layer.

In the magnetoresistive element etc. of the present disclosure the intermediate layer is preferably made up of a non-magnetic material. In a spin injection-type magnetoresistive effect element, specifically, the intermediate layer that makes up a multilayer structure having a TMR (tunnel magnetoresistance) effect is made of an insulating material, and preferably a non-magnetic material. A multilayer structure by a fixed magnetization layer, an intermediate layer and a storage layer, and having a TMR effect, denotes herein a structure in which an intermediate layer made up of a non-magnetic material film and functioning as a tunnel insulating film is sandwiched between a fixed magnetization layer made up of a magnetic material and a storage layer made up of a magnetic material. Examples of materials that are insulating materials and are non-magnetic materials include for instance various insulating materials, dielectric materials and semiconductor materials such as magnesium oxide (MgO), magnesium nitride, magnesium fluoride, aluminum oxide ($AlO_X$), aluminum nitride (AlN), silicon oxide (SiOx), silicon nitride (SiN), $TiO_2$, $Cr_2O_3$, Ge, NiO, $CdO_x$, $HfO_2$, $Ta_2O_5$, $Bi_2O_3$, CaF, $SrTiO_2$, $AlLaO_3$, Mg—$Al_2$—O, Al—N—O, BN, ZnS and the like. The area resistance value of the intermediate layer made of an insulating material is preferably about several tens of $\Omega \cdot \mu m^2$ or less. In a case where the intermediate layer is made of magnesium oxide (MgO), a MgO layer is preferably crystallized, and yet more preferably has a crystal orientation in the (001) direction. In a case where the intermediate layer is made of magnesium oxide (MgO), the thickness thereof is preferably set to 1.5 nm or less. Examples of materials that make up a non-magnetic material film that constitutes a multilayer structure having a GMR (giant magnetoresistance) effect include conductive materials such as Cu, Ru, Cr, Au, Ag, Pt and Ta, and alloys of the foregoing; if conductivity is high (resistivity of several hundred μΩ cm or less), the material may be any non-magnetic material, but preferably a material is selected as appropriate that is unlikely to give rise to interface reactions with the storage layer or the fixed magnetization layer.

An intermediate layer made of an insulating material that is also a non-magnetic material can be obtained for instance by oxidizing or nitriding a metal film formed by sputtering. In a case more specifically where aluminum oxide ($AlO_X$) or magnesium oxide (MgO) is used as the insulating material that constitutes the intermediate layer, examples include for instance a method of oxidizing, in the atmosphere, aluminum or magnesium formed by sputtering, a method of plasma-oxidizing aluminum or magnesium formed by sputtering, a method of oxidizing, by IPC plasma, aluminum or magnesium formed by sputtering, a method of natural oxidation of aluminum or magnesium formed by sputtering, a method of oxidizing, by way of oxygen radicals, aluminum or magnesium formed by sputtering, a method of irradiating aluminum or magnesium formed by sputtering with ultraviolet rays, when causing the aluminum or magnesium to oxidize naturally in oxygen, a method of forming a film of aluminum or magnesium by reactive sputtering, or a method of forming a film of aluminum oxide ($AlO_X$) or magnesium oxide (MgO) by sputtering.

In the magnetoresistive element etc. of the present disclosure, as described above, a form can be adopted where the magnetization direction of the storage layer changes in accordance with the information to be stored, such that the easy magnetization axis of the storage layer is parallel to the stacking direction of the multilayer structure (i.e. of perpendicular magnetization type). In this case a form can be adopted that is made up of a spin injection-type magnetoresistive effect element of perpendicular magnetization type, and a form can further be adopted, in these cases, where a first surface of the multilayer structure is connected to a first electrode, a second surface of the multilayer structure is connected to a second electrode, so that information is stored in the storage layer as a result of flow of current (write current, also referred to as magnetization reversal current and spin polarization current) between the first electrode and the second electrode. That is, a form can be adopted where information is recorded in the storage layer through modification of the magnetization direction of the storage layer as a result of flow of magnetization reversal current in the stacking direction of the multilayer structure.

The fixed magnetization layer may constitute the first surface of the multilayer structure, or the storage layer may constitute the first surface of the multilayer structure.

Figure 25:
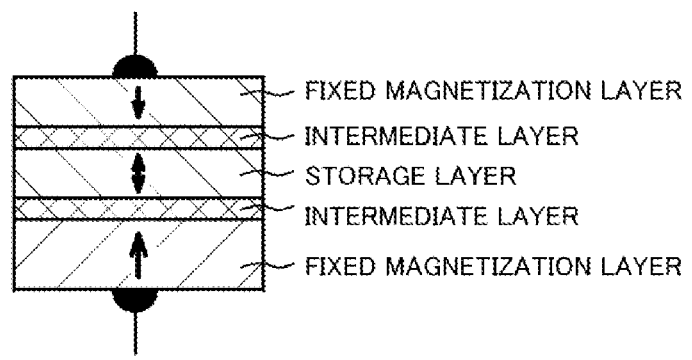
FIG. 25 is a conceptual diagram of a magnetoresistive element of the present disclosure.

As described above, the magnetoresistive element etc. of the present disclosure can adopt a configuration in which a multilayer structure having a TMR effect or GMR effect is configured out of a multilayer made up of a storage layer, an intermediate layer and a fixed magnetization layer. For instance as illustrated in the conceptual diagram of FIG. 3B, when a magnetization reversal current is caused to flow from the storage layer to the fixed magnetization layer, in an antiparallel-arrangement magnetization state, the magnetization of the storage layer reverses on account of the spin torque that acts as a result of injection of electrons from the fixed magnetization layer to the storage layer, whereupon the magnetization direction of the storage layer, the magnetization direction of the fixed magnetization layer (specifically a reference layer) and the magnetization direction of the storage layer take on a parallel arrangement. By contrast, as illustrated in for instance the conceptual diagram of FIG. 3A, when a magnetization reversal current is caused to flow from the fixed magnetization layer to the storage layer in a parallel-arrangement magnetization state, the magnetization of the storage layer reverses on account of the spin torque that acts as a result of flow of electrons from the storage layer to the fixed magnetization layer, and the magnetization direction of the storage layer and the magnetization direction of the fixed magnetization layer (specifically, a reference layer) take on an antiparallel arrangement. Alternatively, as illustrated in the conceptual diagram of FIG. 25, a configuration can be adopted where a multilayer structure having a TMR effect or GMR effect is made up of a fixed magnetization layer, an intermediate layer, a storage layer, an intermediate layer and a fixed magnetization layer. In such a structure it is necessary to impart a difference in the change in magnetic resistance of the two intermediate layers located above and below the storage layer.

The three-dimensional shape of the multilayer structure is preferably cylindrical or cylindrical columnar, from the viewpoint of ease of processing and in terms of ensuring uniformity of the direction of the easy magnetization axis in the storage layer, but the three-dimensional shape of the multilayer structure is not limited thereto, and may be for instance a triangular prism, a square prism, a hexagonal prism or an octagonal prism (including prisms with rounded sides or side edges), or an elliptical column. The surface area of the multilayer structure may be for instance preferably 0.01 $\mu m^2$ or less, from the viewpoint of easily reversing magnetization orientation with a low magnetization reversal current. By causing a magnetization reversal current to flow through the multilayer structure, from the first electrode to the second electrode, or from the second electrode to the first electrode, the direction of magnetization in the storage layer is set to a first direction (direction parallel to the easy magnetization axis) or a second direction (direction opposite to the first direction), and information becomes written as a result in the storage layer.

In the magnetoresistive element etc. of the present disclosure including the various preferred form s and configurations explained above, a form can be adopted where the multilayer structure has a cap layer on the second surface side, for the purpose of preventing interdiffusion of the atoms that make up the electrodes and connection portions and atoms that make up the storage layer, reducing contact resistance, and preventing oxidation of the storage layer. In that case, forms can be adopted where the cap layer has a single-layer structure made up of at least one type of material selected from the group consisting of hafnium, tantalum, tungsten, zirconium, niobium, molybdenum, titanium, vanadium, chromium, magnesium, ruthenium, rhodium, palladium and platinum; or has a single-layer structure made up of an oxide, for instance a magnesium oxide layer, an aluminum oxide layer, a titanium oxide layer, a silicon oxide layer, a $Bi_2O_3$ layer, a $SrTiO_2$ layer, an $AlLaO_3$ layer, an Al—N—O layer, a Mg—Ti—O layer or a $MgAl_2O_4$ layer; or has a multilayer structure (for instance a Ru layer/Ta layer) of at least one type of material layer selected from the group consisting of hafnium, tantalum, tungsten, zirconium, niobium, molybdenum, titanium, vanadium, chromium, magnesium, ruthenium, rhodium, palladium and platinum, and at least one type of oxide layer selected from the group consisting of MgTiO, MgO, AlO and SiO.

The various layers explained above can be formed for instance by physical vapor deposition (PVD) exemplified by sputtering, ion beam deposition, vacuum deposition, or by chemical vapor deposition (CVD) typified by ALD (atomic layer deposition). These layers can be patterned by reactive ion etching (RIE) or ion milling (ion beam etching). Preferably, the various layers are formed continuously in a vacuum apparatus, and preferably are patterned thereafter.

The first electrode, second electrode, first wiring, second wiring, wiring layer and so forth may be made up of a single-layer structure of Ta or TaN, or Cu, Al, Au, Pt, Ti or the like, or compounds thereof, or may alternatively have a multilayer structure of an underlayer made of Cr, Ti or the like, and a Cu layer, Au layer, Pt layer or the like formed thereon. Alternatively, the foregoing may be made up of a single-layer structure of Ta or a compound thereof, or a multilayer structure of Cu, Ti or the like or a compound thereof. These electrodes and so forth can be formed for instance by PVD exemplified by sputtering.

In the magnetoresistive element etc. of the present disclosure a form can be adopted where a selection transistor made up of a field effect transistor is provided below the multilayer structure, for instance in that a projection image in the direction of extension of the second wiring (bit line) connected to the second electrode is perpendicular to a projection image in the direction of extension of a gate electrode (functioning for instance as a word line or an address line) that constitutes the field effect transistor, or in a form where a projection image in the extension direction of the second wiring (bit line) is parallel to the projection image of an extension direction of the gate electrode that constitutes the field effect transistor. Also, a form can be adopted where the projection image in the extension direction of the first wiring (sense line) connected to the first electrode is parallel to the projection image in the extension direction of the second wiring.

In some cases the selection transistor is not necessary.

In a preferred configuration of the magnetoresistive element, a selection transistor made up of a field effect transistor is further present below the multilayer structure, as described above; an example of a more concrete configuration may be for instance as illustrated below, although the configuration is not limited thereto:

a selection transistor formed on the semiconductor substrate; and
an interlayer insulating layer that covers the selection transistor,
wherein a first electrode is formed on the interlayer insulating layer;
the first electrode is electrically connected to one source/drain region of the selection transistor, via a connection hole (or connection hole and landing pad or lower-layer wiring) provided in the interlayer insulating layer;
the multilayer structure is in contact with the first electrode and the second electrode; and
the insulating layer covers the interlayer insulating layer, and surrounds the first electrode, the multilayer structure and the second electrode.

The selection transistor can be for instance configured out of a known MIS-type FET or MOS-type FET. The connection hole that electrically connects the first electrode and the selection transistor can be made of impurity-doped polysilicon or a high-melting point metal or metal silicide such as tungsten, Ti, Pt, Pd, Cu, TiW, TiNW, WSi$_2$, MoSi$_2$ or the like, and can be formed by CVD or by PVD typified by sputtering. Examples of materials that make up the insulating layer, upper insulating layer, interlayer insulating layer, lower insulating film, upper insulating film, insulating material layer, interlayer insulating material layer and so forth include silicon oxide (SiO$_2$), silicon nitride (SiN), SiON, SiOC, SiOF, SiCN, SOG (spin-on-glass), NSG (non-doped silicate glass), BPSG (borophosphosilicate glass), PSG, BSG, PbSG, AsSG, SbSG, LTO, Al$_2$O$_3$ and the like. Alternatively, examples which can be mentioned include low-permittivity insulating materials (for instance fluorocarbons, cycloperfluorocarbon polymers, benzocyclobutene, cyclic fluororesins, polytetrafluoroethylene, amorphous tetrafluoroethylene, polyaryl ethers, aryl fluoride ethers, polyimide fluorides, organic SOG, parylene, fullerene fluorides and amorphous carbon), polyimide resins, fluororesins, Silk (trademark by The Dow Chemical Co.; coating-type low permittivity interlayer insulating film material), and Flare (trademark by Honeywell Electronic Materials Co.; polyaryl ether (PAE)-based material); the foregoing can be used singly or in combinations. Alternative examples include polymethyl methacrylate (PMMA); polyvinylphenol (PVP); polyvinyl alcohol (PVA); polyimides; polycarbonate (PC); polyethylene terephthalate (PET); polystyrene; silanol derivatives (slime coupling agents) such as N-2(aminoethyl) 3-aminopropyl trimethoxysilane (AEAPTMS), 3-mercaptopropyl trimethoxysilane (MPTMS), octadecyltrichlorosilane (OTS) and the like; novolac-type phenolic resins; fluorine-based resins; organic insulating materials (organic polymers) exemplified by linear hydrocarbons having, at an end, a functional group capable of binding to a control electrode, such as octadecanethiol and dodecylisosocyanate, as well as combinations of the foregoing. The insulating layer, upper insulating layer, interlayer insulating layer, lower insulating film, upper insulating film, insulating material layer, interlayer insulating material layer and so forth can be formed on the basis of known methods such as various CVD methods, a coating method, various PVD methods including sputtering and vacuum deposition, various printing methods such as screen printing, and a sol-gel method.

Examples of electronic devices having built therein the magnetoresistive element of the present disclosure include portable electronic devices such as mobile devices, game devices, music devices and video devices, fixed electronic devices, as well as magnetic heads. A further example is a storage device configured out of a non-volatile storage element array configured through two-dimensional arraying, in the form of a matrix, of the magnetoresistive element (specifically a storage element, and more specifically a non-volatile memory cell) of the present disclosure.

Embodiment 1

Figure 2:
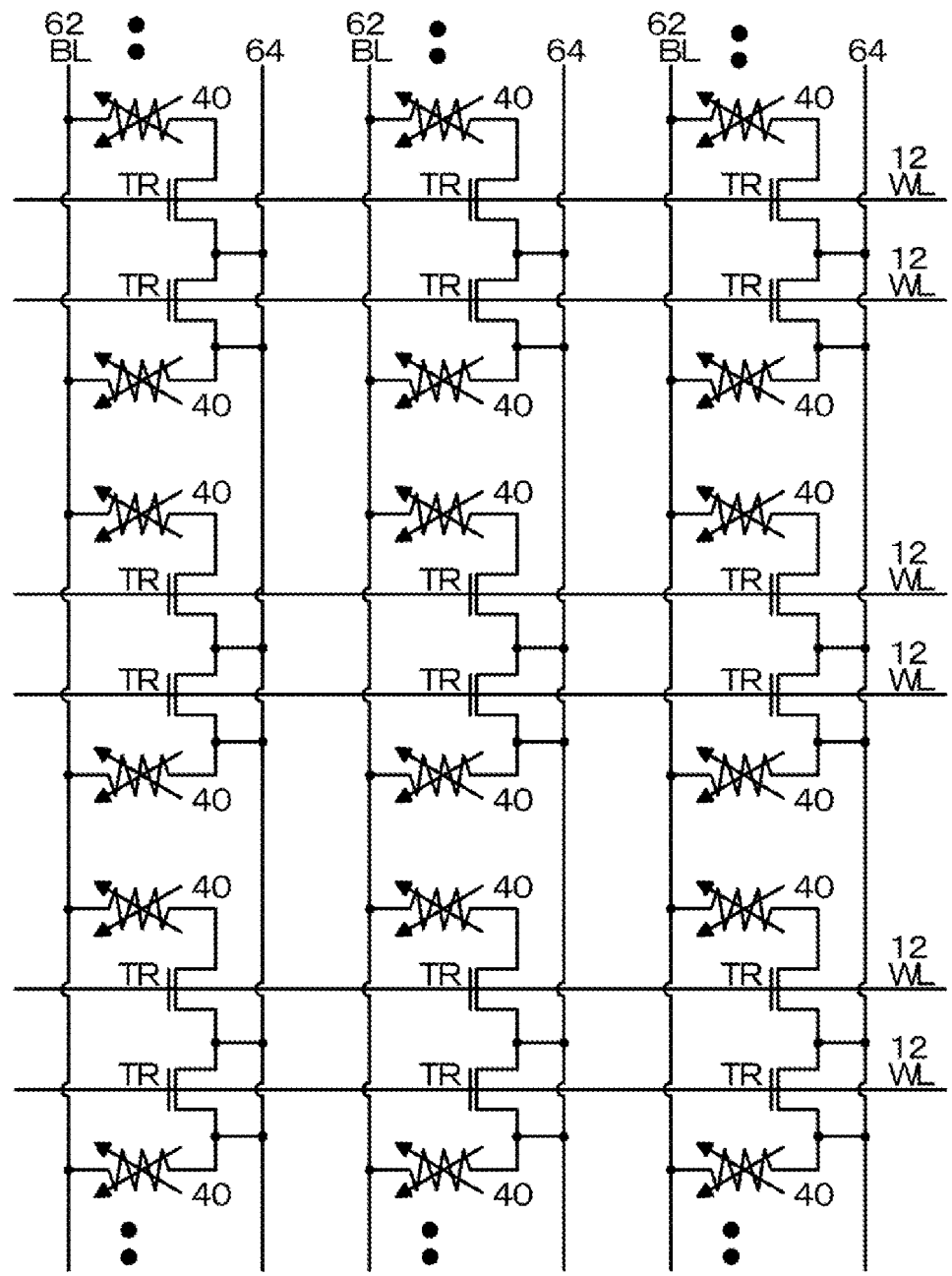
FIG. 2 is an equivalent circuit diagram of the magnetoresistive element of Embodiment 1.

Embodiment 1 relates to a magnetoresistive element according to a first aspect of the present disclosure, and more specifically, to a magnetoresistive element that makes up for instance a storage element (non-volatile memory cell). FIG. 1 illustrates a schematic partial cross-sectional diagram of a magnetoresistive element (spin injection-type magnetoresistive effect element) of Embodiment 1 including a selection transistor, and FIG. 2 illustrates an equivalent circuit diagram thereof. The non-volatile memory cell results from arraying the magnetoresistive element of Embodiment 1 in the form of a two-dimensional matrix. The magnetoresistive elements make up thus a non-volatile memory cell.

The magnetoresistive element of Embodiment 1 has a multilayer structure 40 made up at least of a fixed magnetization layer, an intermediate layer and a storage layer;

a first side wall 51 is formed on a side wall of the multilayer structure 40;
a second side wall 52 is formed on the first side wall 51;
the first side wall 51 is made of an insulating material that prevents intrusion of hydrogen, and
the second side wall 52 is made of a hydrogen storage material.

The second side wall 52 is made of titanium (Ti). The thickness of the second side wall 52 is $2 \times 10^{-8}$ m or larger, preferably $3 \times 10^{-8}$ m or larger; in Embodiment 1, specifically, the thickness of a bottom portion of the second side wall 52 was set for instance to 40 nm.

The first side wall 51 is made of SiN or AlO$_X$, and is specifically made of SiN. The thickness of the first side wall 51 is $1 \times 10^{-8}$ m or larger. In Embodiment 1, specifically, the thickness of a bottom portion of the first side wall 51 was set for instance to 20 nm. The inclination angle of the first side wall 51 is not particularly limited, but is preferably in the range of 45 degrees to 60 degrees, from the viewpoint of ensuring uniformity of film quality of the second side wall 52 that is formed on the first side wall 51. In Embodiment 1, specifically, the inclination angle was set to 50 degrees. An extension portion 51' of the first side wall 51 extends over a below-described upper insulating film 25

In the magnetoresistive element of Embodiment 1 or of Embodiment 2 to Embodiment 5 described below, the metal atoms that make up the fixed magnetization layer and the storage layer include cobalt (Co) atoms or iron (Fe) atoms, or cobalt atoms and iron atoms (Co—Fe); specifically the fixed magnetization layer and the storage layer are made up of a Co—Fe—B alloy layer [for instance $(Co_{20}Fe_{80})_{80}B_{20}$ alloy layer]. Metal atoms that constitute the intermediate layer made up of a non-magnetic material and that functions as tunnel insulating film include magnesium (Mg) atoms and aluminum (Al) atoms. Specifically, the intermediate layer may be made up MgO. By configuring the intermediate layer out of an MgO layer it becomes possible to increase the rate of change of magnetic resistance (MR ratio). As a result, the efficiency of spin injection can be increased, and magnetization reversal current density necessary in order to reverse the magnetization direction of the storage layer can be reduced. The three-dimensional shape of the multilayer structure 40 is cylindrical (cylindrical column), but is not limited thereto, and may be for instance a quadrangular prism shape. The multilayer structure 40 is surrounded by the insulating layer 26.

In the magnetoresistive element of Embodiment 1 or of Embodiment 2 to Embodiment 5 described below the magnetization direction of the storage layer changes in accordance with the information to be stored. An easy magnetization axis of the storage layer is parallel to the stacking direction of the multilayer structure 40 (i.e. the storage layer is of perpendicular magnetization type). That is, the magnetoresistive element is made up of a spin injection-type magnetoresistive effect element of perpendicular magnetization type. In other words, the magnetoresistive element is configured out of an MTJ element. The magnetization direction of the fixed magnetization layer is the magnetization direction serving as a reference for the information to be stored in the storage layer, such that information "0" and information "1" are determined by the relative angle between the magnetization direction of the storage layer and the magnetization direction of the fixed magnetization layer. A first surface of the multilayer structure 40 is in contact with a first electrode 31, and a second surface of the multilayer structure 40 is in contact with a second electrode 32, such that information becomes stored in the storage layer as a result of the flow of current (magnetization reversal current) between the first electrode 31 and the second electrode 32. The fixed magnetization layer may constitute the first surface of the multilayer structure 40, or the storage layer may constitute the first surface of the multilayer structure 40. Second wiring (bit line) 62 is connected to the second electrode 32 via a connection hole 61.

The various layer build-ups explained above are set out in Table 2 below.

<Table 2>
Multilayer Structure
Storage layer: 1.6 nm thick $(Co_{20}Fe_{80})_{80}B_{20}$ layer
Intermediate layer: 1.0 nm thick MgO layer
Magnetic fixed layer: 1.0 nm thick $(Co_{20}Fe_{80})_{80}B_{20}$ layer
First electrode: 10 nm thick TaN
Second electrode: 50 nm thick Ta In the magnetoresistive elements of Embodiment 1 or Embodiment 2 to Embodiment 5 described below a selection transistor TR made up of a field effect transistor is provided below the multilayer structure 40; for instance a form can be adopted in which a projection image in the direction of extension of the second wiring (bit line) 62 connected to the second electrode 32 via the connection hole 61 is perpendicular to a projection image in the direction of extension of a gate electrode 12 (functioning for instance as a word line or an address line) that constitutes the selection transistor TR; and a form can be adopted where a projection image in the direction in which the second wiring 62 extends is parallel to the projection image of the direction of extension of the gate electrode 12 that constitutes the selection transistor TR. In a more concrete configuration, the projection image in a direction in which the second wiring 62 extends is perpendicular to the projection image in a direction in which the gate electrode 12 extends, and is parallel to a projection image in the direction in which the first wiring (sense line) 64 extends. In FIG. 1 and in FIG. 8, FIG. 9, FIG. 10, FIG. 11, FIG. 12, FIG. 13, FIG. 14, FIG. 15, FIG. 16, FIG. 17, FIG. 18, FIG. 19, FIG. 20 and FIG. 21 described below the directions in which the gate electrode 12, the second wiring 62 and the first wiring 64 extend are different from those explained above, for the purpose of simplifying the drawings. The second wiring 62 and the first wiring 64 extend in a direction perpendicular to the paper in the drawings.

For instance the selection transistor TR formed on the semiconductor substrate 10 made up of a silicon semiconductor substrate is configured out of a channel formation region 14 formed on the semiconductor substrate 10, a channel formation region 14 and source/drain regions 15A, 15B formed on the semiconductor substrate 10, and a gate electrode 12 provided opposing the channel formation region 14 across a gate insulating layer 13. A gate side wall 16 made of $SiO_2$ is formed on a side wall of the gate electrode 12. The selection transistor TR is covered by a lower insulating film 21 and an interlayer insulating layer 22. The lower insulating film 21 is made of SiN and the interlayer insulating layer 22 is made of $SiO_2$. The reference symbol 11 is an element separation region.

The first electrode 31 is formed on the interlayer insulating layer 22, the first electrode 31 is electrically connected to one source/drain region 15A of the selection transistor TR via a connection hole 23 provided in the lower insulating film 21 and the interlayer insulating layer 22, the multilayer structure 40 is in contact with the first electrode 31 and the second electrode 32, the upper insulating film 25 covers the interlayer insulating layer 22, and as described above, the extension portion 51' of the first side wall 51 extends over the upper insulating film 25, the insulating layer 26 is formed on the extension portion 51', such that the insulating layer 26 surrounds the first electrode 31, the multilayer structure 40 and the second electrode 32.

The upper insulating film 25 is made of SiN and the insulating layer 26 is made of $SiO_2$. Specifically, the first electrode 31 is formed on a base portion of the multilayer structure 40 (specifically the top of the connection hole 23), and the first side wall 51 covers a side wall of the base portion.

The other source/drain region 15B of the selection transistor TR is connected to the first wiring (sense line) 64 via the connection hole 24 provided in the lower insulating film 21 and the interlayer insulating layer 22, and via the connection hole 63 formed in the upper insulating film 25 and the insulating layer 26.

An overview of the method for producing the magnetoresistive element of Embodiment 1 will be explained next with reference to FIG. 6A, FIG. 6B, FIG. 6C, FIG. 7A, FIG. 7B and FIG. 7C. The selection transistor TR is not depicted in FIG. 6B, FIG. 6C, FIG. 7A, FIG. 7B and FIG. 7C.

[Step-100]

Firstly an element separation region 11 is formed on the semiconductor substrate 10 made up of a silicon semiconductor substrate, in accordance with a known method, and then the selection transistor TR made up of the gate insulating layer 13, the gate electrode 12, the gate side wall 16 and the source/drain regions 15A, 15B is formed on the portion, of the semiconductor substrate 10, that is surrounded by the element separation region 11. The portion of the semiconductor substrate 10 positioned between the source/drain region 15A and the source/drain region 15B corresponds to the channel formation region 14. The lower insulating film 21, the interlayer insulating layer 22, the upper insulating film 25 and a base material layer 70 are formed next. A connection hole 23 made up of a tungsten plug is formed at the portion of the lower insulating film 21, the interlayer insulating layer 22, the upper insulating film 25 and the base material layer 70 above one source/drain region 15A, and a connection hole 24 made up of a tungsten plug is formed at the portion of the lower insulating film 21, the interlayer insulating layer 22, the upper insulating film 25 and the base material layer 70, above the other source/drain region 15B. A selection transistor TR can thus be obtained that is covered by the lower insulating film 21 and the interlayer insulating layer 22 (see FIG. 6A).

[Step-110]

Figure 6A:
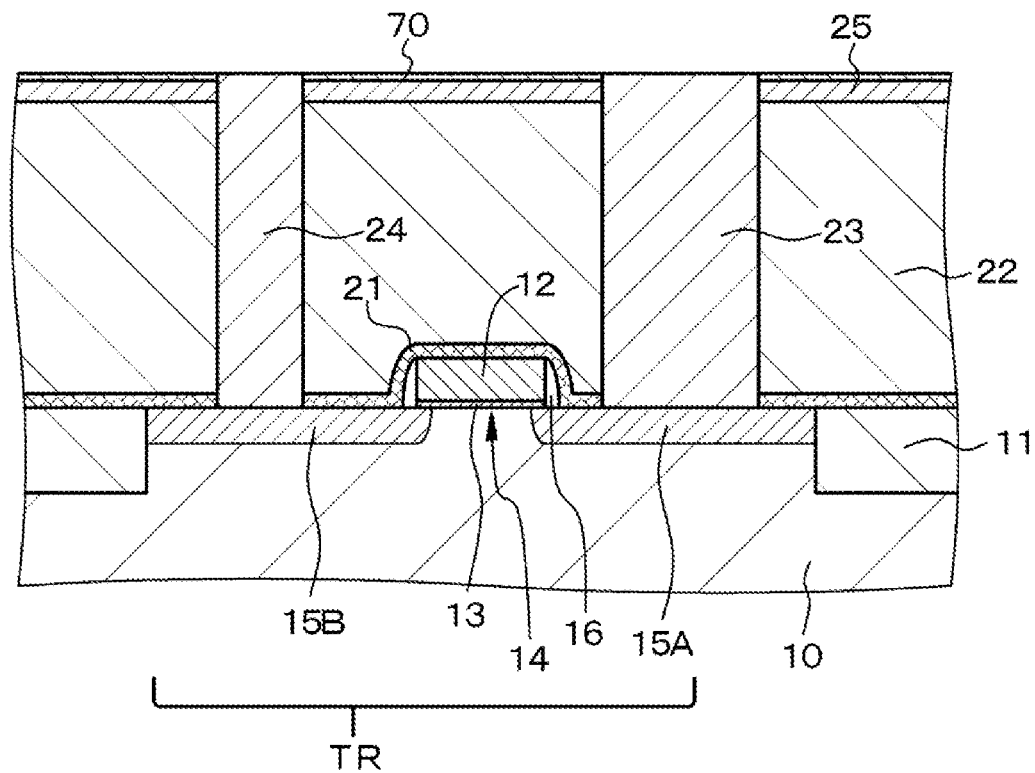
FIG. 6A, FIG. 6B and FIG. 6C are schematic partial end-view diagrams of for instance a multilayer structure for explaining a production method of the magnetoresistive element of Embodiment 1.
Figure 6B:
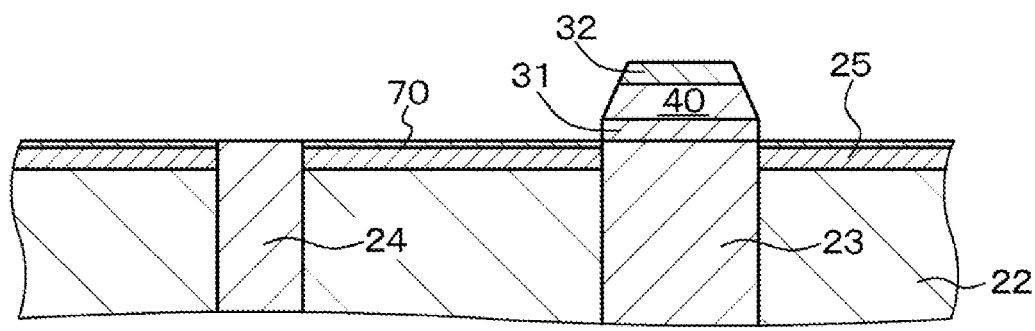
Figure 6C:
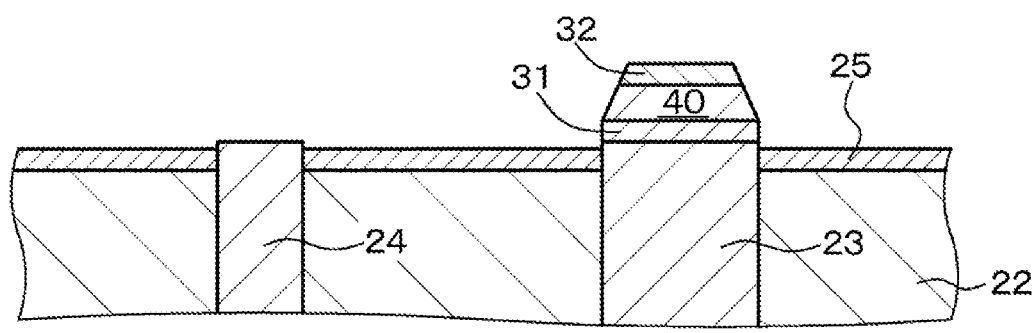
Figure 7A:
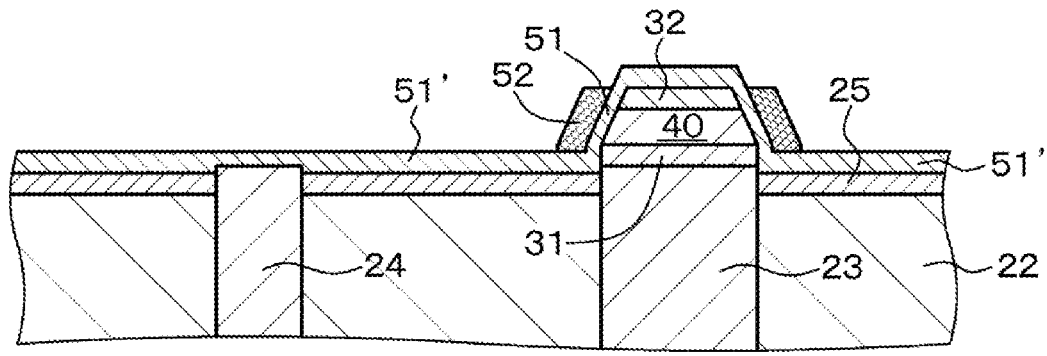
FIG. 7A, FIG. 7B and FIG. 7C are schematic partial end-view diagrams, following FIG. 6C, for explaining a production method of the magnetoresistive element of Embodiment 1.
Figure 7B:
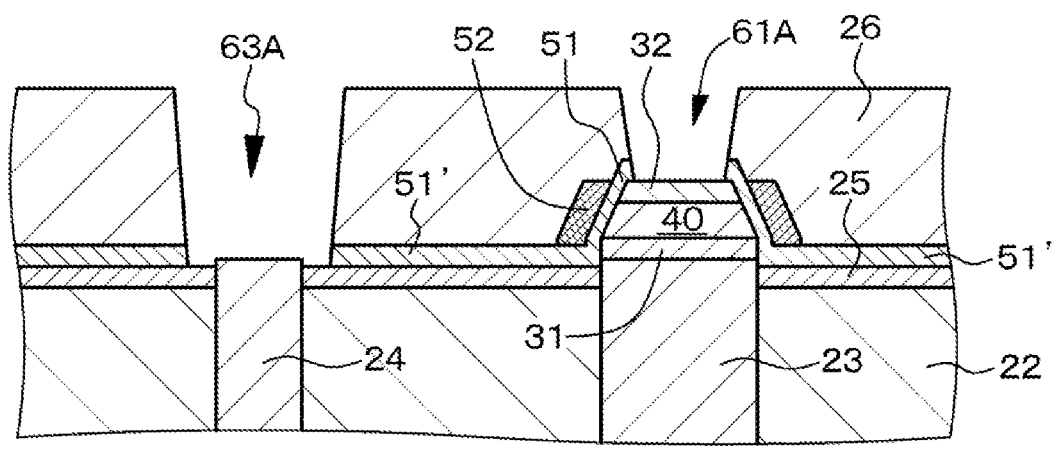
Figure 7C:
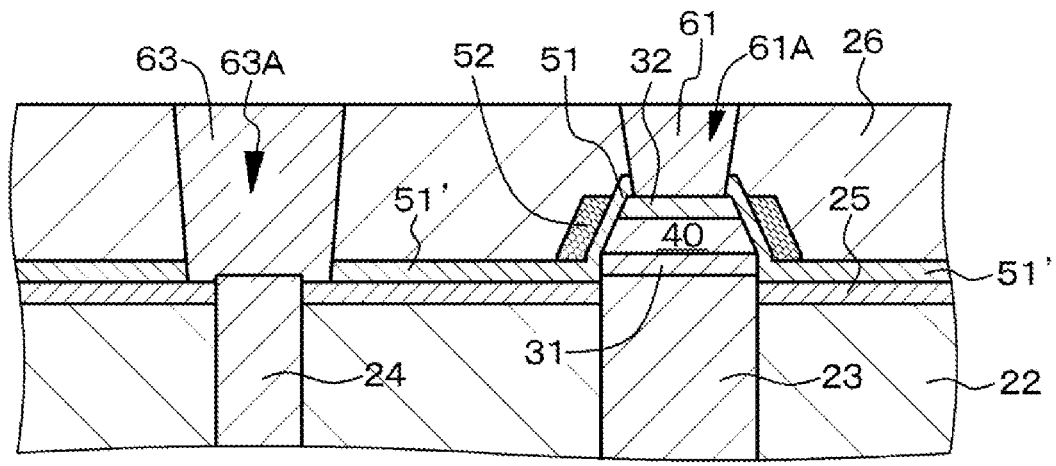

Thereafter, the first electrode 31, the multilayer structure 40 and the second electrode 32 are formed on the base material layer 70, and subsequently the second electrode 32, the multilayer structure 40 and the first electrode 31 are etched by reactive ion etching (RIE) (see FIG. 6B), with further etching of the base material layer 70 (see FIG. 6C). The first electrode 31 is in contact with the connection hole 23. The intermediate layer made up of magnesium oxide (MgO) was formed through formation of a MgO layer by RF magnetron sputtering. Other layers were formed by DC magnetron sputtering. Instead of being patterned by RIE, the various layers can be patterned by ion milling (ion beam etching).

[Step-120]

The first side wall 51 is formed next on the side walls of the second electrode 32, the multilayer structure 40 and the first electrode 31. The extension portion 51' of the first side wall 51 extends over the upper insulating film 25. Further, the second side wall 52 is formed on the side walls of the first side wall 51 that is formed on the second electrode 32, the multilayer structure 40 and the first electrode 31 (see FIG. 7A). The insulating layer 26 is formed on the entire surface, and an opening 61A is formed in the insulating layer 26 above the multilayer structure 40. The multilayer structure 40 (more specifically, the second electrode 32) is exposed at the bottom portion of the opening 61A. An opening 63A is formed in the insulating layer 26 and the first side wall extension portion 51', above the connection hole 24. The connection hole 24 is exposed at the bottom portion of the opening 63A. The structure illustrated in FIG. 7B can be thus obtained.

[Step-130]

Thereafter the connection holes 61, 63 made up of a tungsten plug are formed on the entire surface, by CVD. The structure illustrated in FIG. 7C can be thus obtained.

[Step-140]

Next, the second wiring (bit line) 62 and the first wiring (sense line) 64 are formed on the insulating layer 26 in accordance with a known method. The magnetoresistive element of Embodiment 1 illustrated in FIG. 1 can be thus obtained.

As described above, a general MOS production process can be used in the production of the magnetoresistive element of Embodiment 1, and can be used for general-purpose memories.

Figure 3A:
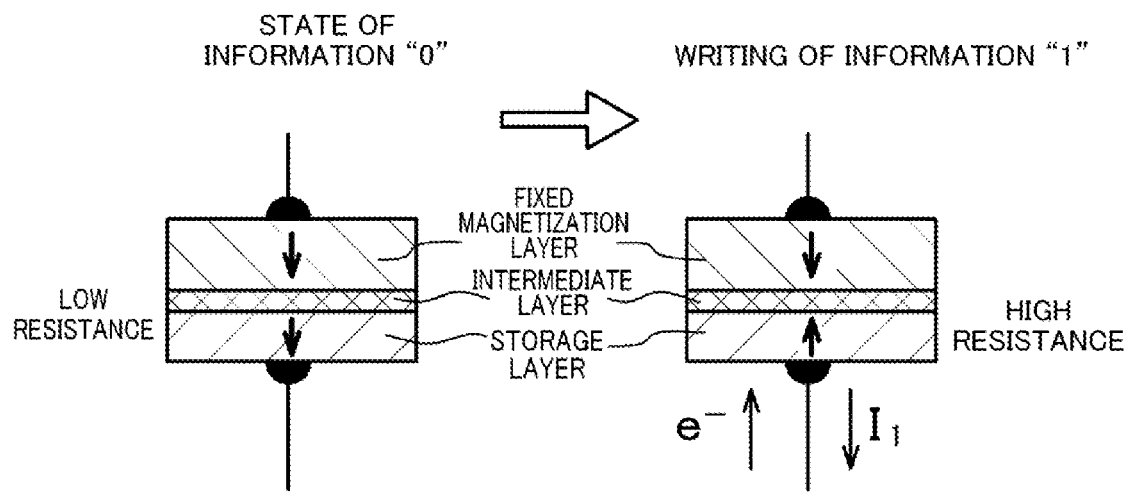
FIG. 3A and FIG. 3B are conceptual diagrams of a spin injection-type magnetoresistive effect element that utilizes spin-injection magnetization reversal.
Figure 3B:
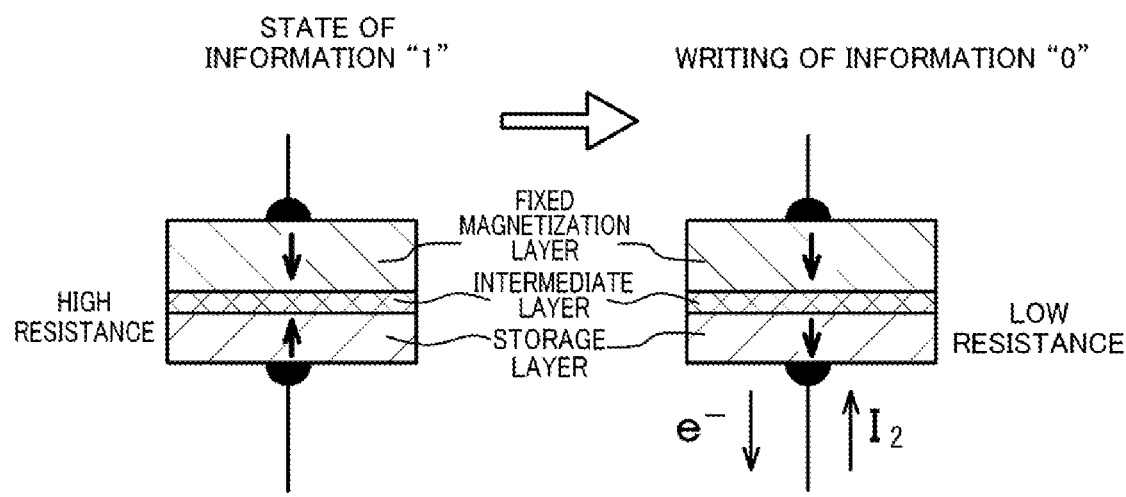
Figure 4A:
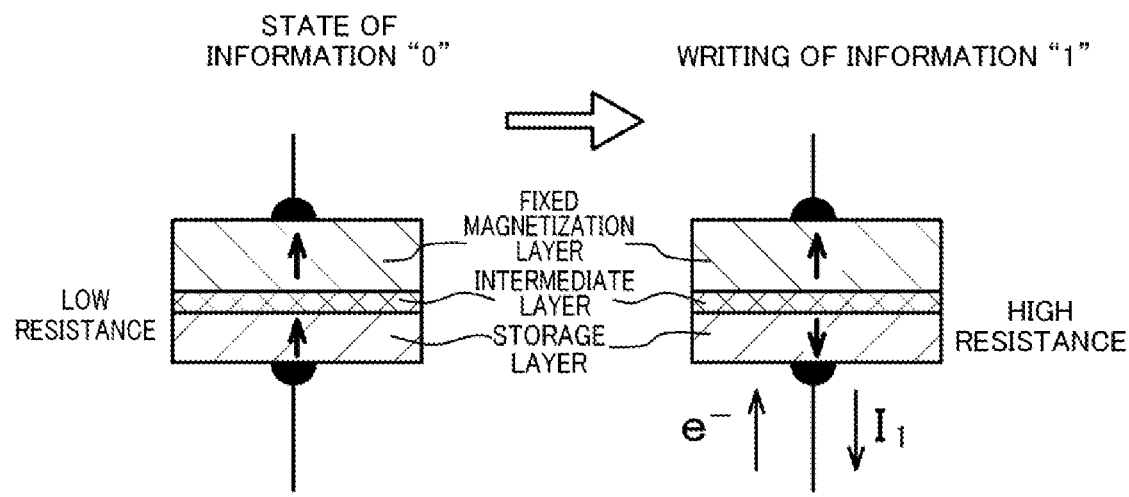
FIG. 4A and FIG. 4B are conceptual diagrams of a spin injection-type magnetoresistive effect element that utilizes spin-injection magnetization reversal.

As illustrated in the conceptual diagrams of FIG. 3A and FIG. 4A, information "0" stored in the storage layer is rewritten to "1". Specifically, in a parallel magnetization state a write current (magnetization reversal current) $I_1$ is caused to flow from the fixed magnetization layer to the selection transistor TR, via the storage layer. In other words, electrons are caused to flow from the storage layer to the fixed magnetization layer. Specifically, for instance $V_{dd}$ is applied to the second wiring (bit line) 62, to ground thus the other source/drain region 15B of the selection transistor TR. Electrons having spin in one orientation and having reached the fixed magnetization layer pass through the fixed magnetization layer. Meanwhile, electrons having spin in the other orientation are reflected on the fixed magnetization layer. When such electrons enter the storage layer, torque is exerted onto the storage layer, whereupon the storage layer reverses to the antiparallel magnetization state. The magnetization direction of the fixed magnetization layer is fixed, and accordingly cannot be reversed; the storage layer may thus conceivably reverse in order to preserve the angular momentum of the whole system. In FIG. 3A, FIG. 3B, FIG. 4A and FIG. 4B the fixed magnetization layer is depicted at the top, but the fixed magnetization layer may be positioned at the bottom.

Figure 4B:
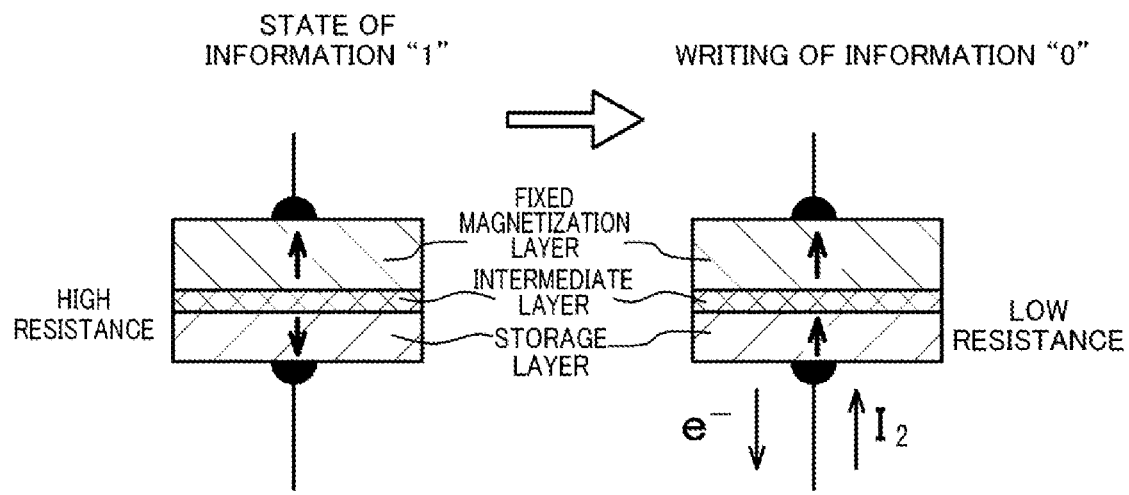

As illustrated in the conceptual diagrams of FIG. 3B and FIG. 4B, information "1" stored in the storage layer is rewritten to "0". Specifically, in an antiparallel magnetization state a write current I2 is caused to flow from the selection transistor TR to the fixed magnetization layer via the storage layer. In other words, electrons flow from the fixed magnetization layer t to the storage layer. Specifically, for instance $V_{dd}$ is applied to the other source/drain region 15B of the selection transistor TR, to ground the second wiring (bit line) 62. Electrons that have passed through the fixed magnetization layer acquire spin polarization, i.e. a different arises in the number of electrons with up and down orientations. The sign of the degree of spin polarization flips when the thickness of the intermediate layer is sufficiently small, and the spin polarization thereof relaxes and reaches the storage layer before a non-polarized state (state of identical number of up orientations and down orientations) in an ordinary non-magnetic material is brought about; as a result, some electrons flip, i.e. the orientation of the spin angular momentum is changed, in order to reduce the energy of the whole system. Since the total angular momentum of the system must be conserved, a reaction equivalent to the total change of the angular momentum derived from electrons of flipped orientation is exerted as a result on the magnetic moment in the storage layer. When the current i.e. the number of electrons passing through the fixed magnetization layer is small per unit time, the total number of electrons that change orientation is likewise small, and accordingly the change in angular momentum generated in the magnetic moment in the storage layer is small; when current increases, however, a large angular momentum change can be applied to the storage layer per unit time. The change in angular momentum over time is herein torque; when the torque exceeds a certain threshold value, the magnetic moment of the storage layer starts to reverse, and stabilizes upon having rotated by 180 degrees on account of the uniaxial anisotropy of the storage layer. That is, the antiparallel magnetization state reverses to the parallel magnetization state, and the information "0" becomes stored in the storage layer.

To read the information written in the storage layer, the selection transistor TR in the magnetoresistive element that is to read the information is brought to a conduction state. A current is then caused to pass between the second wiring (bit line) 62 and the first wiring (sense line) 64, and the potential appearing in the second wiring 62 is input to the other input portion of a comparator circuit (not shown) that makes up a comparing circuit (not shown). Meanwhile, the potential from a circuit (not shown) for obtaining a reference resistance value is input to one input portion of the comparator circuit that constitutes the comparing circuit. In the comparing circuit it is then compared whether the potential appearing in the second wiring 62 is high or low with respect to the potential from the circuit for obtaining the reference resistance value, and the comparison result (information 0/1) is output from an output portion of the comparator circuit that constitutes the comparing circuit.

In the magnetoresistive element of Embodiment 1 a first side wall made up of an insulating material that prevents intrusion of hydrogen, and a second side wall made of a hydrogen storage material are formed on the side wall of a multilayer structure, and hence the multilayer structure of the magnetoresistive element does not come readily in contact, during the process of production, with hydrogen generated in for instance the insulating layers, and the various layers that make up the multilayer structure of the magnetoresistive element are not prone to being reduced. It becomes therefore possible to effectively curtail the occurrence of various problems such as degradation of the information retention characteristic and resistance value variability in the magnetoresistive element.

For instance in a case where the height of the multilayer structure 40 is large, significant differences may arise between the depth of the opening 61A and the depth of the opening 63A, and it may be difficult to simultaneously form the connection hole 61 and the connection hole 63. In such a case, the connection hole 61 may be formed after formation of the opening 61A, and subsequently the connection hole 63 may be formed after formation of the opening 63A. The order of formation of the connection hole 61 and the connection hole 63 may be reversed.

Figure 5:
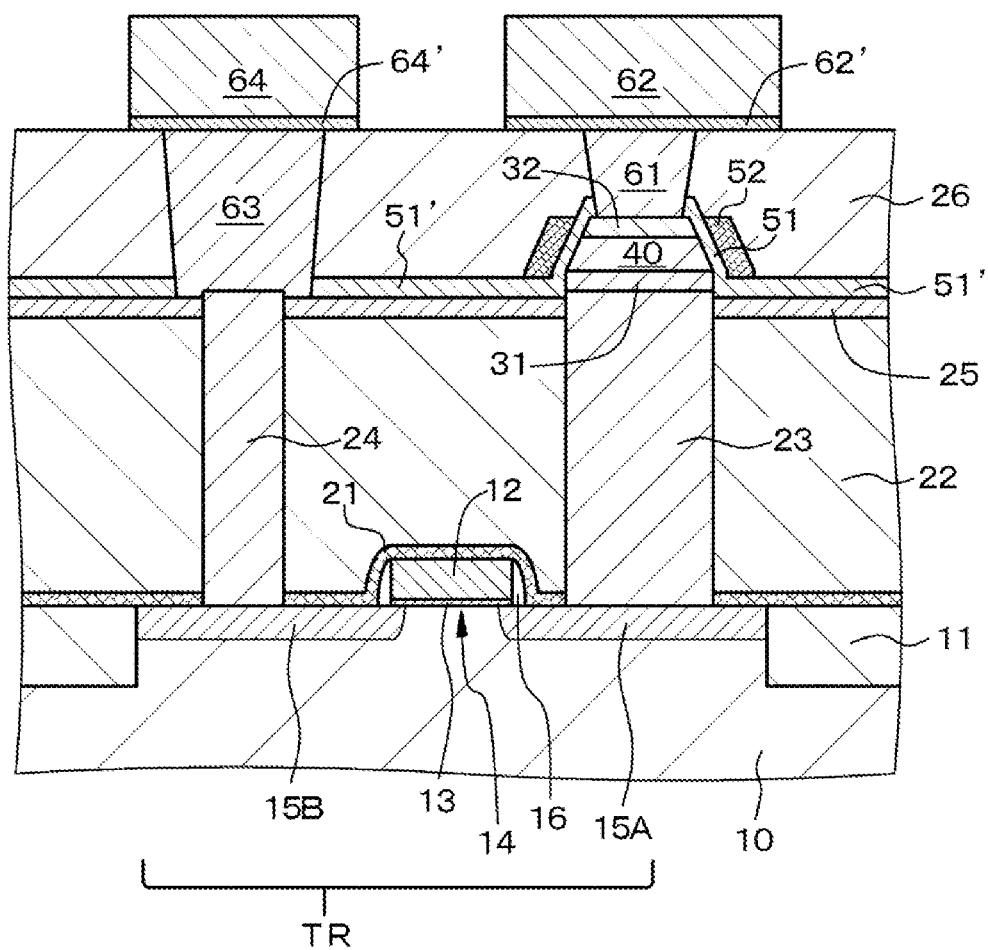
FIG. 5 is a schematic partial cross-sectional diagram of a variation of the magnetoresistive element of Embodiment 1.

As illustrated in FIG. 5, an underlayer 62' made of a hydrogen storage material, specifically titanium (Ti), may be formed between the second wiring 62 and the insulating layer 26, and an underlayer 64' made of a hydrogen storage material, specifically titanium (Ti), may be formed between the first wiring 64 and the insulating layer 26.

The widths of the underlayer 62' positioned above the multilayer structure 40 and of the underlayer 64' positioned above the connection hole 61 may be set to be larger than at other portions. Alternatively, the widths of the underlayers 62', 64' may be set to be larger than the widths of the wirings 62, 64. That is, the underlayers 62', 64' may be formed over a large surface area, so long as there is no short-circuit between the second wiring (bit line) 62 and the first wiring (sense line) 64 that are adjacent.

Although not depicted in the figures, a layer made of a hydrogen storage material, specifically titanium (Ti), may be formed on the top surfaces of the second wiring 62 and the first wiring 64. Further, the interlayer insulating material layer may be filled in between the second wiring 62 and the first wiring 64, and a layer made of titanium (Ti) may be formed over the interlayer insulating material layer, from the top surfaces of the second wiring 62 and the first wiring 64, so that there is no short-circuit between the first wiring and the second wiring.

Embodiment 2

Figure 8:
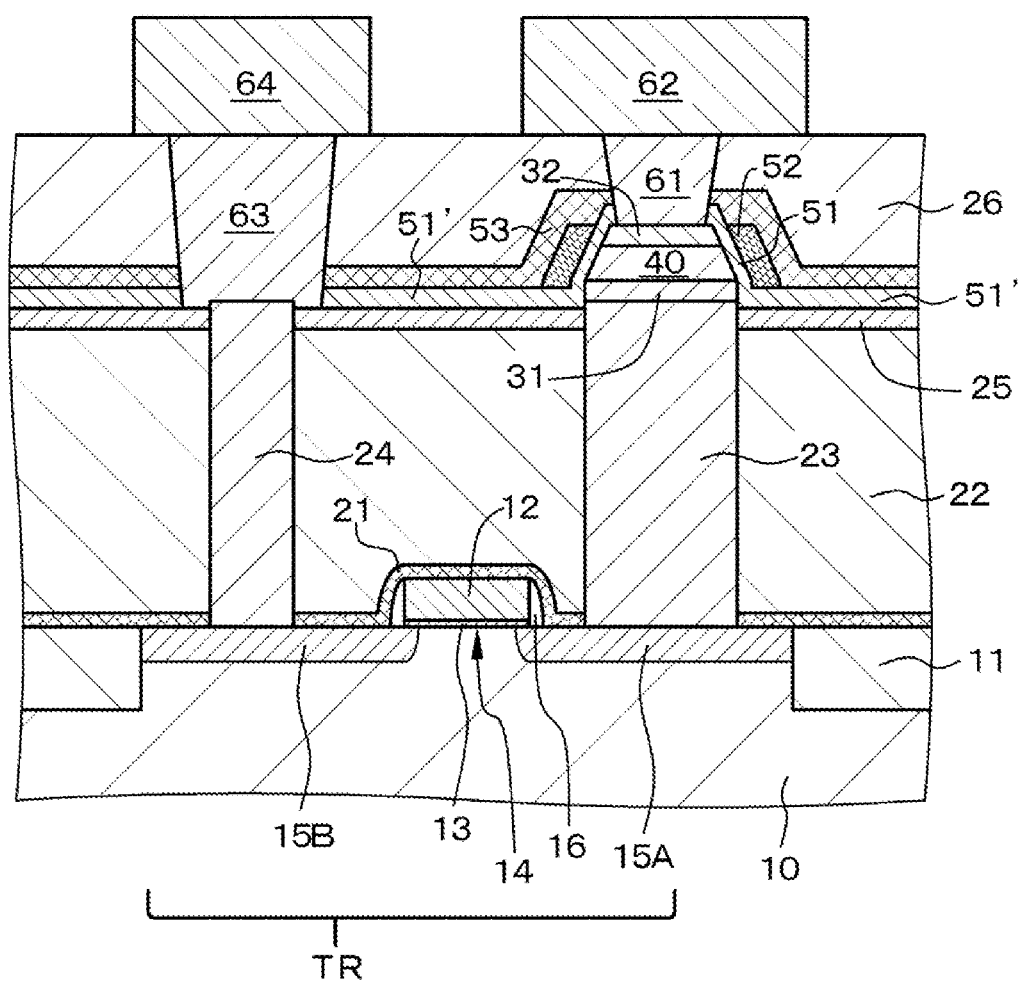
FIG. 8 is a schematic partial cross-sectional diagram of a magnetoresistive element of Embodiment 2.

Embodiment 2 is a variation of Embodiment 1. FIG. 8 illustrates a schematic partial cross-sectional diagram of a magnetoresistive element of Embodiment 2.

In the magnetoresistive element of Embodiment 2 a third side wall 53 made of an insulating material that prevents intrusion of hydrogen is formed on the second side wall 52. The third side wall 53 is made of SiN or $AlO_x$ (in Embodiment 2, specifically, of SiN). In Embodiment 2 the third side wall 53 may be formed after formation of the second side wall 52, in a process similar to that of [Step 120] in Embodiment 1.

The film quality of the SiN that constitutes the third side wall 53 is higher than the film quality of the SiN that constitutes the first side wall 51. Specifically, infrared spectroscopy may be performed and the proportion of the Si—H spectrum peak with respect to Si—N spectrum peak is worked out, such that if a proportion $P_3$ of the spectrum peak of SiN that constitutes the third side wall 53 is lower than a proportion $P_1$ of the spectrum peak of SiN that constitutes the first side wall 51, it is considered that the film quality of the SiN that constitutes the third side wall 53 is higher. As an example, the value of $P_3$ can be for instance 0.04 or less.

Except for the above points, the configuration and structure of the magnetoresistive element of Embodiment 2 can be set to be identical to the configuration and structure of the magnetoresistive element of Embodiment 1, and thus a detailed explanation thereof will be omitted.

In the magnetoresistive element of Embodiment 2 the third side wall made of an insulating material that prevents intrusion of hydrogen is further formed on the side wall of the multilayer structure, and hence the multilayer structure of the magnetoresistive element is yet less likely to come in contact, during the process of production, with hydrogen generated in for instance the insulating layers, and the various layers that make up the multilayer structure of the magnetoresistive element are yet less prone to being reduced. It becomes therefore possible to curtail, yet more reliably, the occurrence of various problems such as degradation of the information retention characteristic and resistance value variability in the magnetoresistive element.

Figure 9:
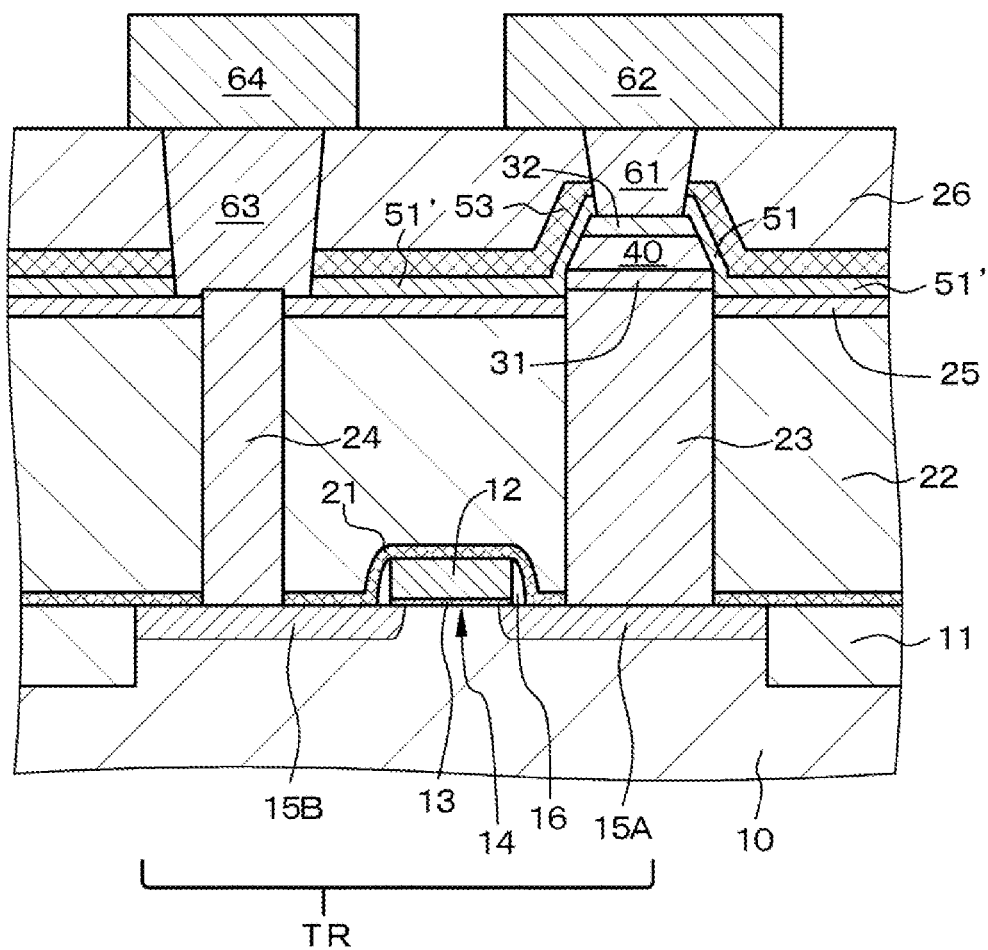
FIG. 9 is a schematic partial cross-sectional diagram of a variation of the magnetoresistive element of Embodiment 2.

In some cases formation of the second side wall 52 may be omitted, and the third side wall 53 may be formed on the first side wall 51, as illustrated in FIG. 9. In this case as well, preferably the film quality of the SiN that constitutes the third side wall 53 is higher than the film quality of the SiN that constitutes the first side wall 51.

Embodiment 3

Figure 10:
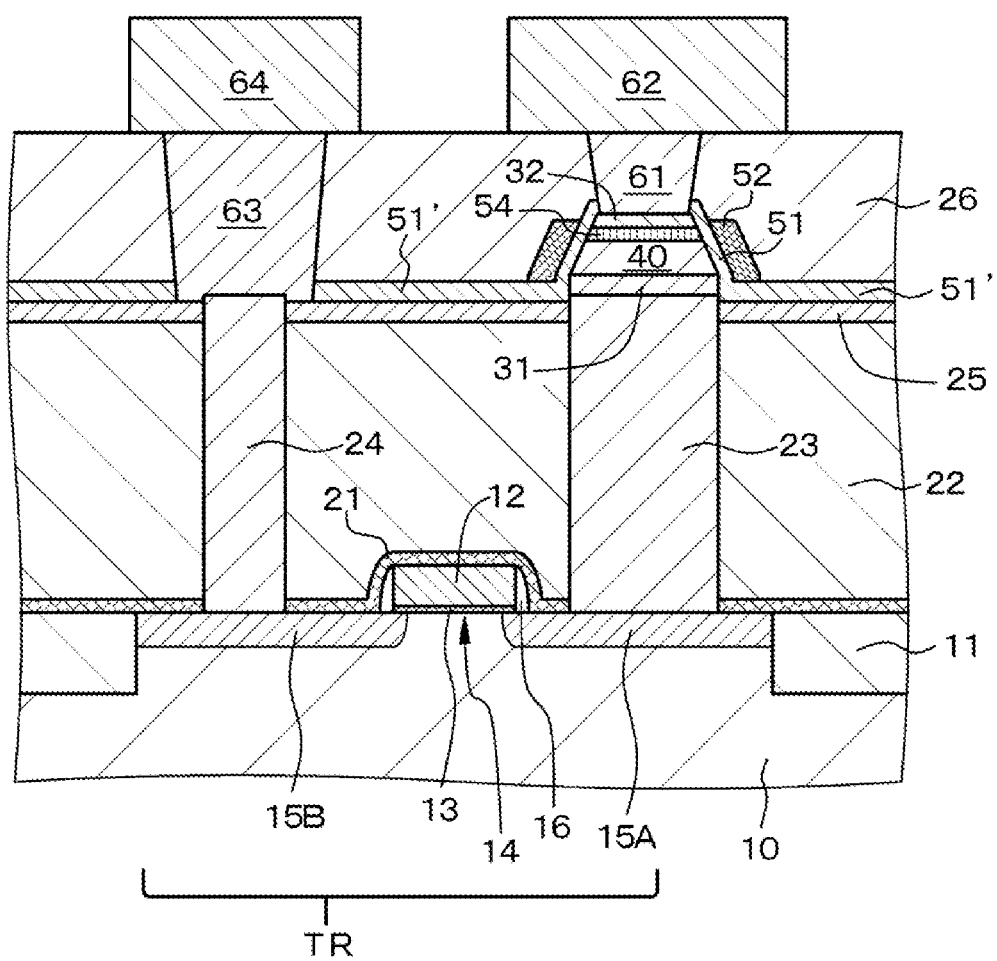
FIG. 10 is a schematic partial cross-sectional diagram of a magnetoresistive element of Embodiment 3.

Embodiment 3 relates to a magnetoresistive element according to a second aspect and third aspect of the present disclosure, and is a variation of Embodiment 1 and Embodiment 2. FIG. 10 illustrates a schematic partial cross-sectional diagram of a magnetoresistive element of Embodiment 3. The magnetoresistive element of Embodiment 3 has the multilayer structure 40 made up at least of a fixed magnetization layer, an intermediate layer and a storage layer.

In the magnetoresistive element of Embodiment 3, the multilayer structure 40 further has an upper hydrogen storage layer 54 thereon or thereabove (specifically thereon, in Embodiment 3). Although not essentially, the first side wall 51 is formed on a side wall of the multilayer structure 40, and the first side wall 51 further covers the side wall of the upper hydrogen storage layer 54 made of titanium (Ti). The second electrode 32 is formed on the upper hydrogen storage layer 54. Such a structure can be obtained in a process similar to that of [Step 110] in Embodiment 1, through formation of the first electrode 31, the multilayer structure 40, the upper hydrogen storage layer 54 and the second electrode 32 on the base material layer 70, followed by etching of the second electrode 32, the upper hydrogen storage layer 54, the multilayer structure 40 and first electrode 31 by reactive ion etching (RIE).

In the magnetoresistive element of Embodiment 3 an upper hydrogen storage layer is formed on the multilayer structure, and hence the multilayer structure of the magnetoresistive element is yet less likely to come in contact, during the process of production, with hydrogen generated in for instance the insulating layers, and the various layers that make up the multilayer structure of the magnetoresistive element are even yet less prone to being reduced. It becomes therefore possible to curtail, yet more reliably, the occurrence of various problems such as degradation of the information retention characteristic and resistance value variability in the magnetoresistive element.

Figure 11:
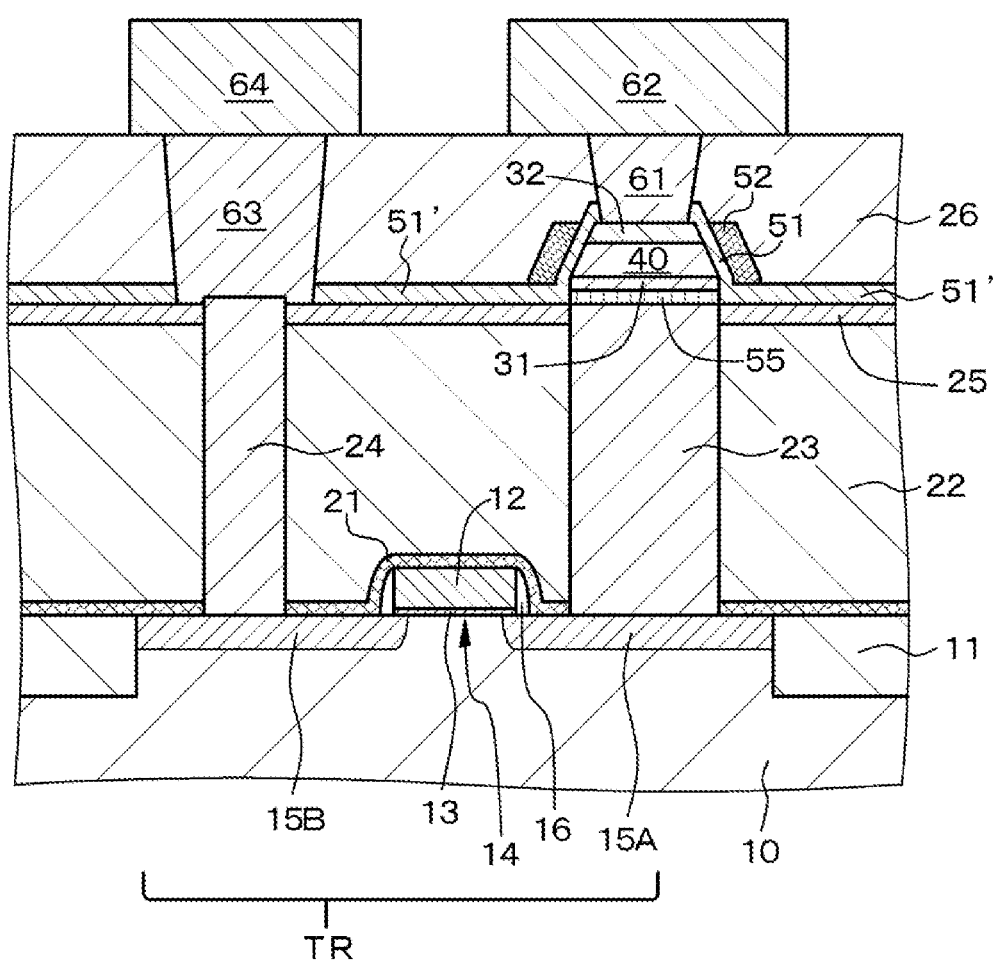
FIG. 11 is a schematic partial cross-sectional diagram of Variation example 1 of the magnetoresistive element of Embodiment 3.

Alternatively, in Variation example 1 of the magnetoresistive element of Embodiment 3 the multilayer structure 40 has, thereunder or therebelow (specifically thereunder), a lower hydrogen storage layer 55 made of titanium (Ti) as illustrated in FIG. 11. The first electrode 31 is formed on the lower hydrogen storage layer 55. Although not essentially, the first side wall 51 is formed on a side wall of the multilayer structure 40, and the first side wall 51 covers the side wall of the lower hydrogen storage layer 55. The lower hydrogen storage layer 55 is formed on a base portion (specifically the top of the connection hole 23), and the first side wall 51 covers the side wall of the base portion. Such a structure can be obtained in a process similar to that of [Step 110] in Embodiment 1, through formation of the lower hydrogen storage layer 55, the first electrode 31, the multilayer structure 40 and the second electrode 32 on the base material layer 70, followed by etching of the second electrode 32, the multilayer structure 40, the first electrode 31, and the lower hydrogen storage layer 55 by reactive ion etching (RIE).

In the magnetoresistive element of Variation example 1 of Embodiment 3 a lower hydrogen storage layer is formed below the multilayer structure, and hence the multilayer structure of the magnetoresistive element is yet less likely to come in contact, during the process of production, with hydrogen generated in for instance the interlayer insulating layer, and the various layers that make up the multilayer structure of the magnetoresistive element are yet less prone to being reduced. It becomes therefore possible to curtail, yet more reliably, the occurrence of various problems such as degradation of the information retention characteristic and resistance value variability in the magnetoresistive element.

Figure 12:
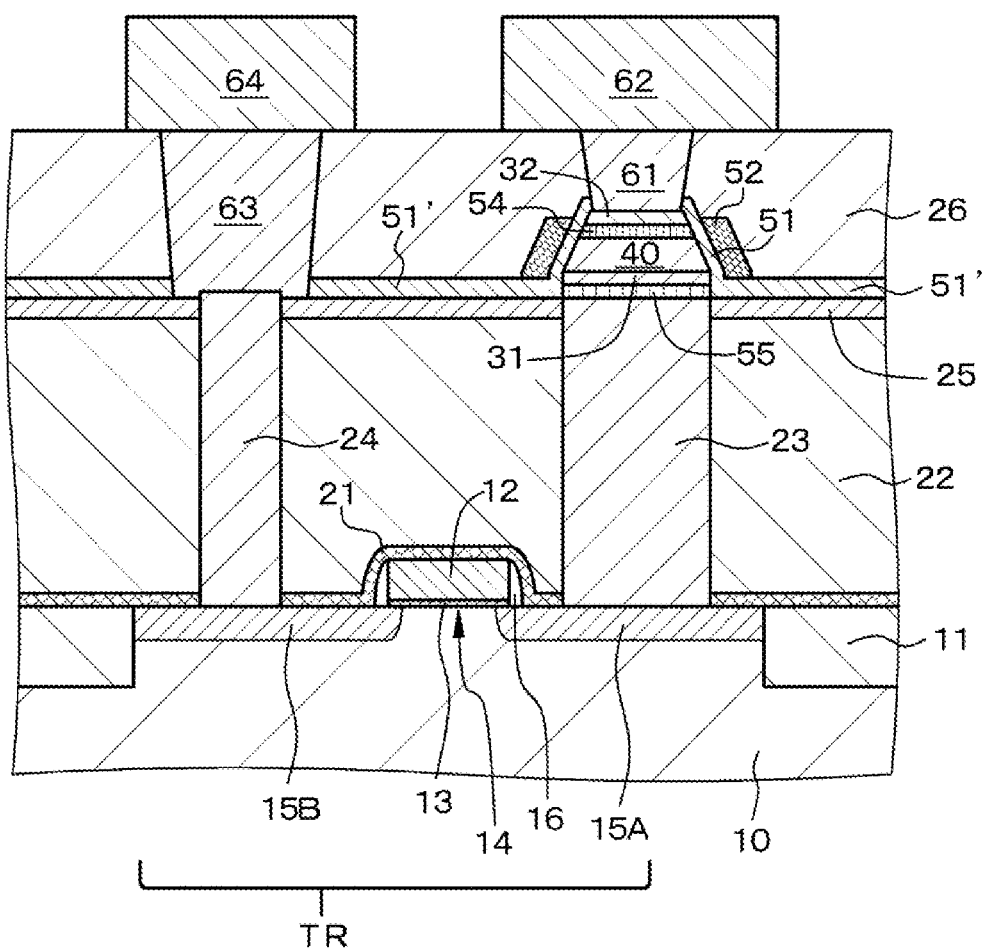
FIG. 12 is a schematic partial cross-sectional diagram of a magnetoresistive element being a combination of the magnetoresistive element of Embodiment 3 and Variation example 1 thereof.

The magnetoresistive element of Embodiment 3 and the magnetoresistive element of Variation example 1 of Embodiment 3 can be combined, as illustrated in the schematic partial cross-sectional diagram of FIG. 12.

Except for the above features, the configuration and structure of the magnetoresistive element in Embodiment 3 and the variation thereof can be set to be similar to the configuration and structure of the magnetoresistive elements of Embodiment 1 and Embodiment 2, and hence a detailed explanation thereof will be omitted herein.

Embodiment 4

Figure 13:
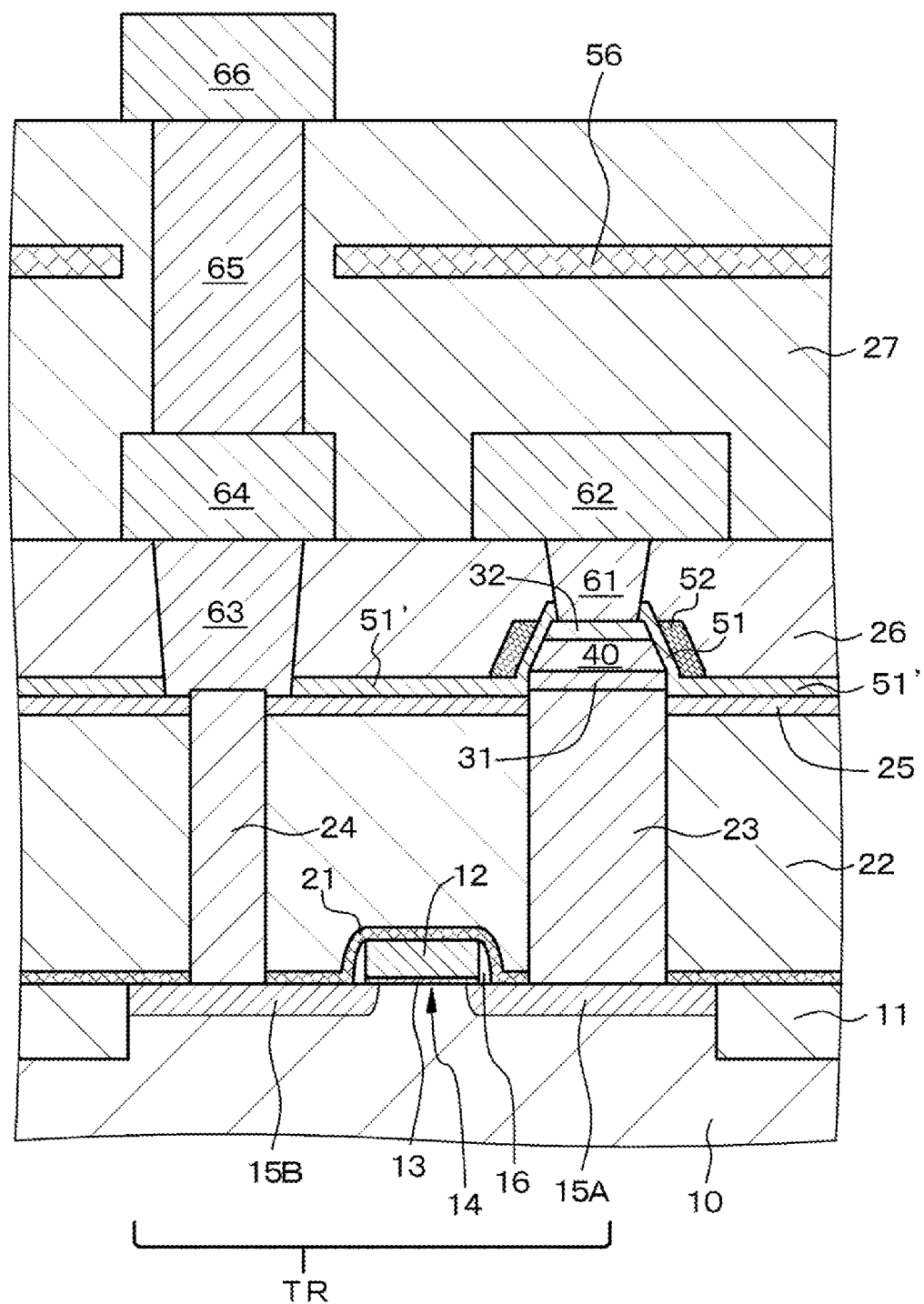
FIG. 13 is a schematic partial cross-sectional diagram of a magnetoresistive element of Embodiment 4.

Embodiment 4 is a variation of Embodiment 1 to Embodiment 3. FIG. 13 illustrates a schematic partial cross-sectional diagram of a magnetoresistive element of Embodiment 4. The magnetoresistive element of Embodiment 4 has the multilayer structure 40 made up at least of a fixed magnetization layer, an intermediate layer and a storage layer. In the magnetoresistive element of Embodiment 4 the multilayer structure 40 is covered by an upper insulating layer 27, while an upper interlayer film 56 made of a hydrogen storage material (specifically titanium, Ti) is formed within the upper insulating layer 27. Although not limited thereto, the upper interlayer film 56 occupies a surface area that is 50% or more of the surface area of the region taken up by the magnetoresistive element, and preferably takes up a surface area that is as large as possible. The thickness of the upper interlayer film 56 or the below-described lower interlayer film 57 is $1 \times 10^{-8}$ m or larger, preferably $2 \times 10^{-8}$ m or larger, as described above. The thickness of the upper interlayer film 56 or the lower interlayer film 57 is herein the thickness when the upper interlayer film 56 or the lower interlayer film 57 is formed as a so-called solid film. A feature wherein the upper interlayer film 56 or lower interlayer film 57 is formed as a so-called solid film signifies that the upper interlayer film 56 or lower interlayer film 57 is formed in the entirety of a below-described magnetoresistive element array portion 81. In a case where the thickness of the upper interlayer film 56 or lower interlayer film 57 is set to $2 \times 10^{-8}$ m, on a solid film basis, and the set thickness of the upper interlayer film 56 or lower interlayer film 57 is set to $4 \times 10^{-8}$ m, if an area of 50% of the surface area of the region occupied by the magnetoresistive element is taken up by the upper interlayer film 56 or lower interlayer film 57, the volume of the upper interlayer film 56 or lower interlayer film 57 is then identical for the solid film basis and for the set thickness. In a case where the thickness of the upper interlayer film 56 or lower interlayer film 57 is set to $2 \times 10^{-8}$ m, on a solid film basis, and the set thickness of the upper interlayer film 56 or lower interlayer film 57 is set to $3 \times 10^{-8}$ m, if an area of 67% of the surface area of the region occupied by the magnetoresistive element is taken up by the upper interlayer film 56 or lower interlayer film 57, the volume of the upper interlayer film 56 or lower interlayer film 57 is then identical for the solid film basis and for the set thickness. Specifically, with $T_1$ as the thickness of the upper interlayer film 56 or lower interlayer film 57, on a solid film basis, and $T_2$ as the set thickness of the upper interlayer film 56 or lower interlayer film 57, if an area of $(T_1/T_2) \times 100\%$ of the region occupied by the magnetoresistive element is taken up by the upper interlayer film 56 or lower interlayer film 57, the volume of the upper interlayer film 56 or lower interlayer film 57 is then identical for the solid film basis and for the set thickness.

Figure 14:
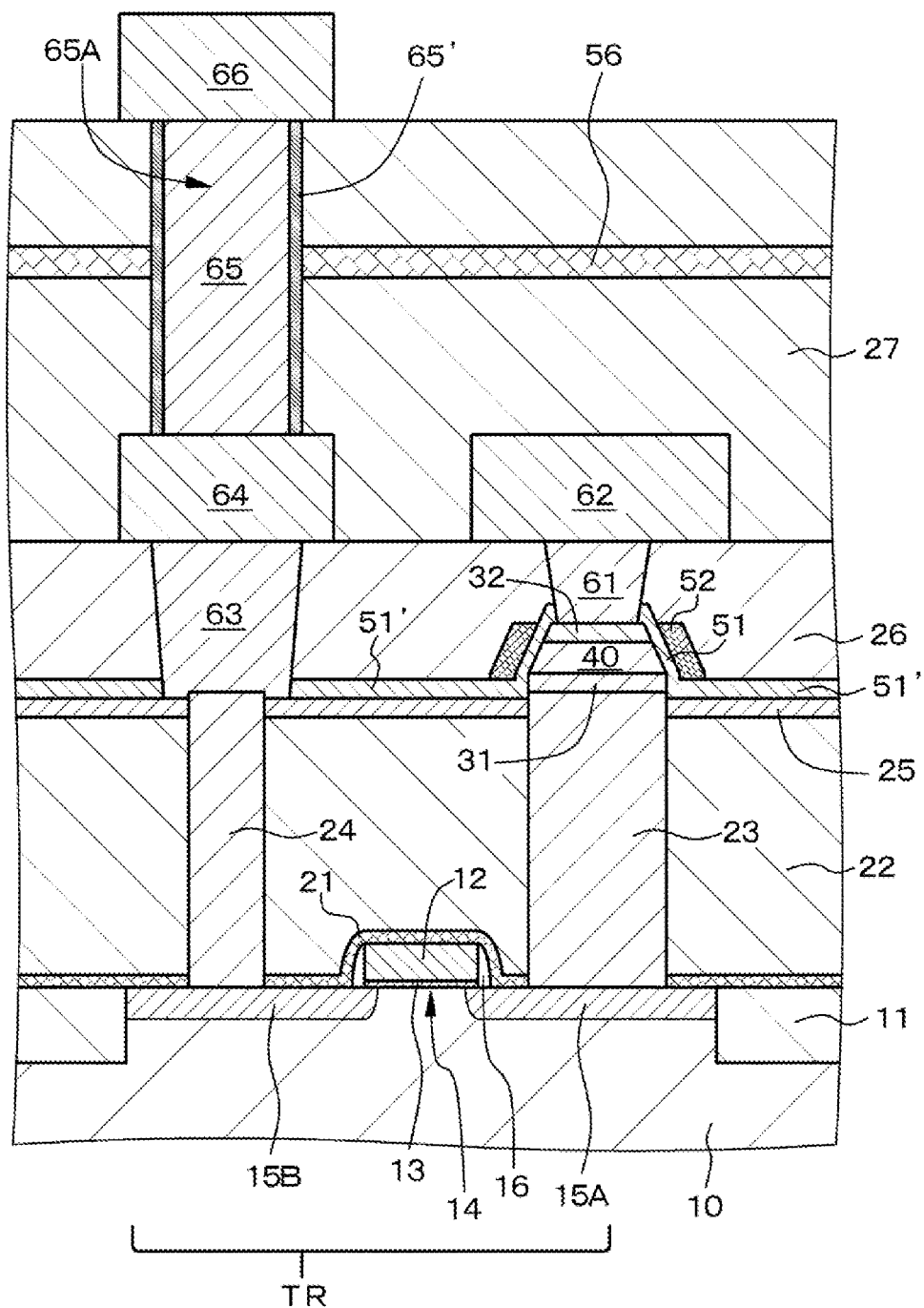
FIG. 14 is a schematic partial cross-sectional diagram of Variation example 1 of the magnetoresistive element of Embodiment 4.

The upper interlayer film 56 is formed for instance so as not to come in contact with a connection hole 65 formed on the first wiring 64. A wiring layer 66 is formed in contact with the connection hole 65, on the upper insulating layer 27. Alternatively, as illustrated in FIG. 14 in Variation example 1 of the magnetoresistive element of Embodiment 4, an insulating material layer 65' for instance made of $SiO_2$, SiN, SiCN or $Al_2O_3$ is formed on the inner wall of an opening 65A formed in the upper insulating layer 27, and the connection hole 65 made up of a tungsten plug is formed in the interior of the opening 65A, surrounded by the insulating material layer 65'. Such a structure allows reliably preventing short-circuits between the upper interlayer film 56 and the connection hole 65.

These structures can be obtained by forming a lower layer portion of the upper insulating layer 27, forming thereafter the upper interlayer film 56, and forming then an upper layer portion of the upper insulating layer 27.

Figure 15:
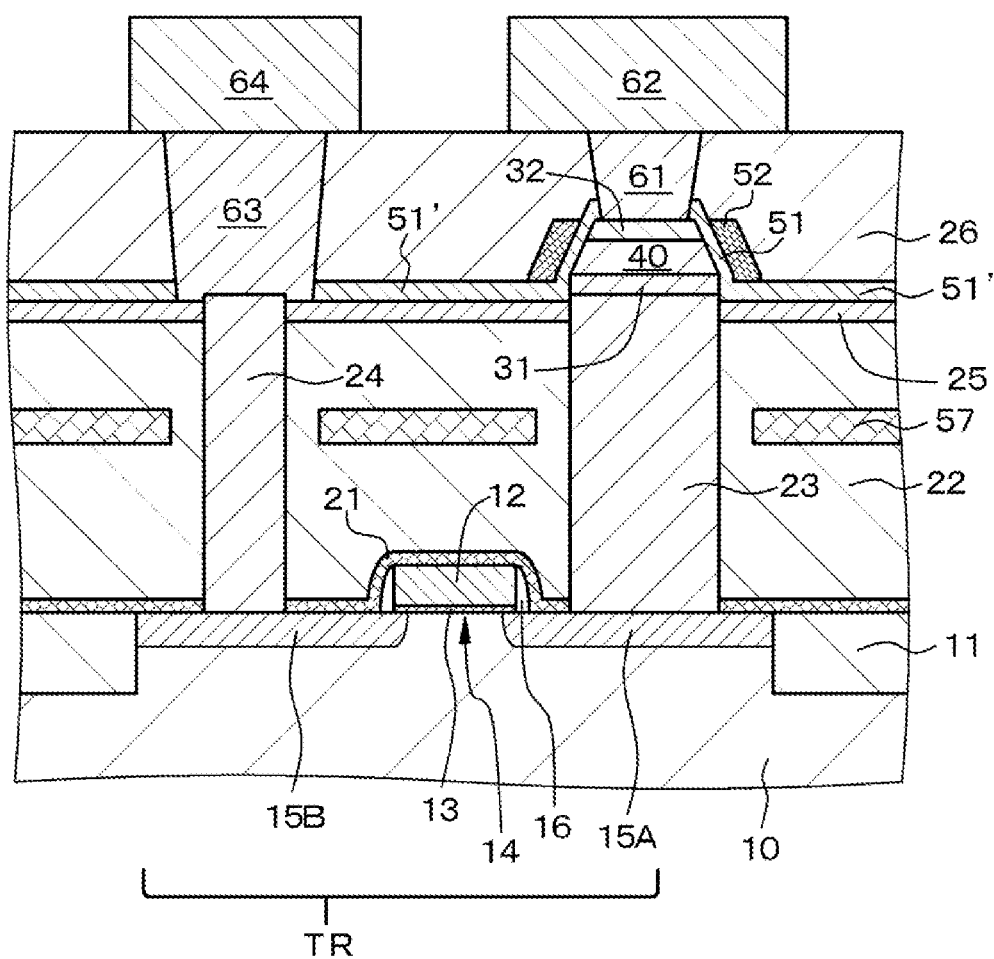
FIG. 15 is a schematic partial cross-sectional diagram of Variation example 2 of the magnetoresistive element of Embodiment 4.
Figure 16:
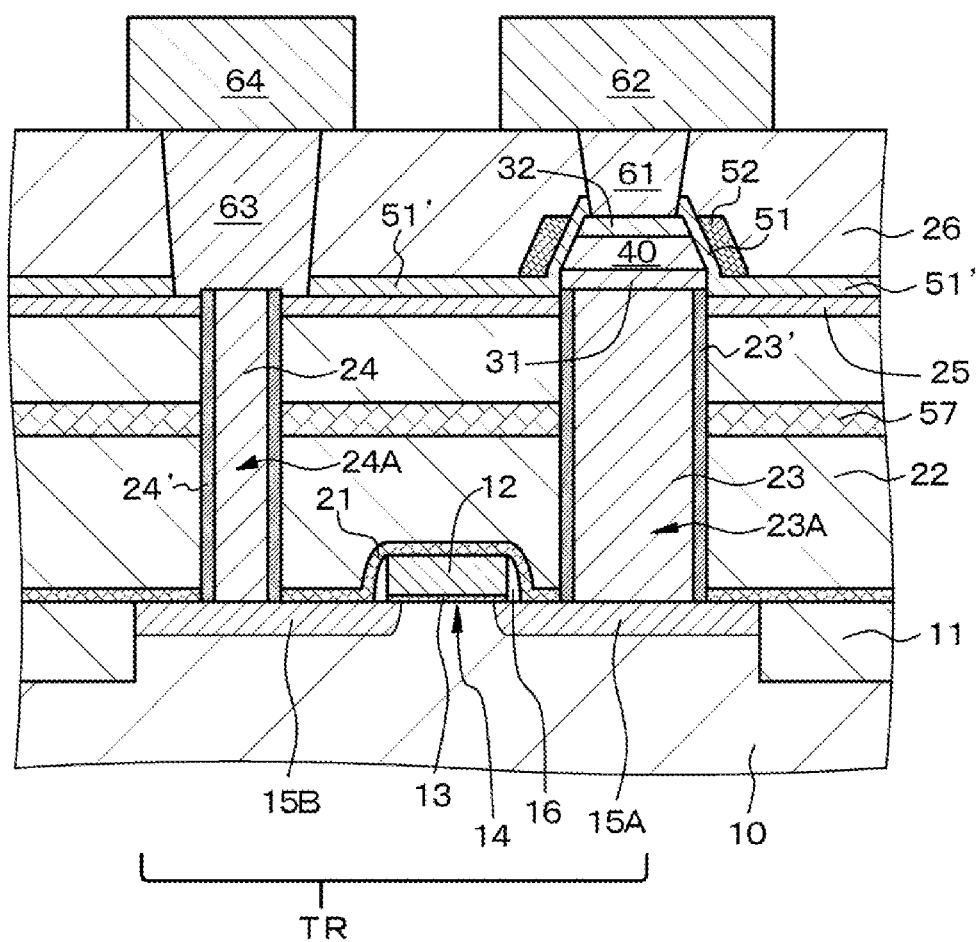
FIG. 16 is a schematic partial cross-sectional diagram of Variation example 3 of the magnetoresistive element of Embodiment 4.

As illustrated in FIG. 15, in Variation example 2 of the magnetoresistive element of Embodiment 4 the multilayer structure 40 is formed on the interlayer insulating layer 22. The lower interlayer film 57 made of a hydrogen storage material (specifically titanium, Ti) is formed in the interior of the interlayer insulating layer 22. The lower interlayer film 57 is formed so as not to be in contact with the connection holes 23, 24. Although not limited thereto, the lower interlayer film 57 occupies a surface area that is 50% or more of the surface area of the region taken up by the magnetoresistive element, and preferably takes up a surface area that is as large as possible. Alternatively, as illustrated in FIG. 16, in Variation example 3 of the magnetoresistive element of Embodiment 4, insulating material layers 23', 24' for instance made of $SiO_2$, SiN, SiCN or $Al_2O_3$ are formed on the inner walls of the openings 23A, 24A formed in the interlayer insulating layer 22, and the connection holes 23, 24 each made up of a tungsten plug are formed in the interior of the openings 23A, 24A, surrounded by the insulating material layers 23', 24'. Such a structure allows reliably preventing short-circuits between the lower interlayer film 57 and the connection holes 23, 24.

These structures can be obtained by forming the lower layer portion of the interlayer insulating layer 22, forming thereafter the lower interlayer film 57, and further forming then the upper layer portion of the interlayer insulating layer 22.

Figure 17:
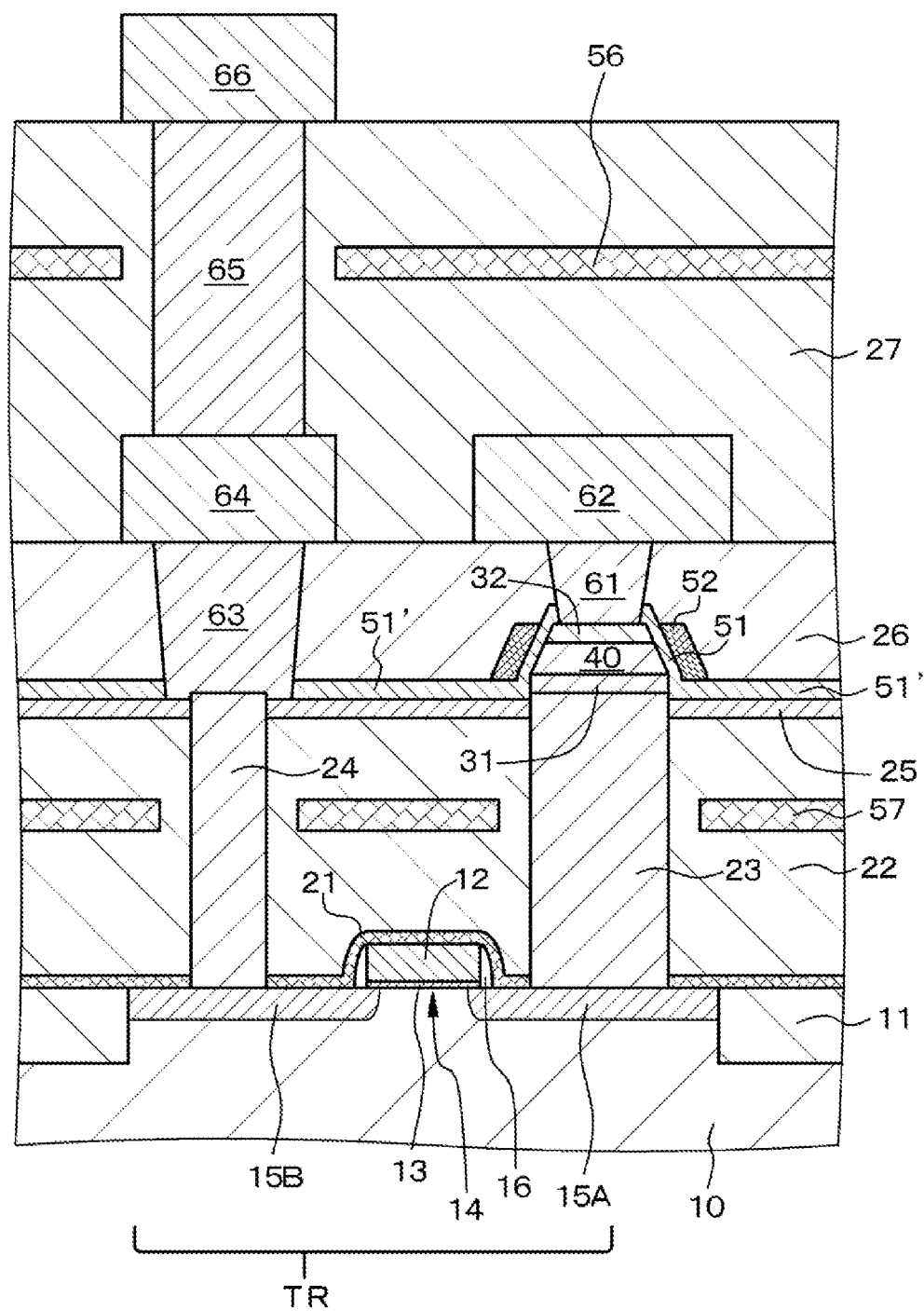
FIG. 17 is a schematic partial cross-sectional diagram of Variation example 4 of the magnetoresistive element of Embodiment 4.

As illustrated in FIG. 17, Variation example 4 of the magnetoresistive element of Embodiment 4 is a combination of the magnetoresistive element (see FIG. 13) of Embodiment 4 and Variation example 2 (see FIG. 15) of Embodiment 4, wherein the upper interlayer film 56 made of a hydrogen storage material (specifically titanium, Ti) is formed within the upper insulating layer 27, and the lower interlayer film 57 made of a hydrogen storage material (specifically titanium, Ti) is formed within the interlayer insulating layer 22.

Figure 18:
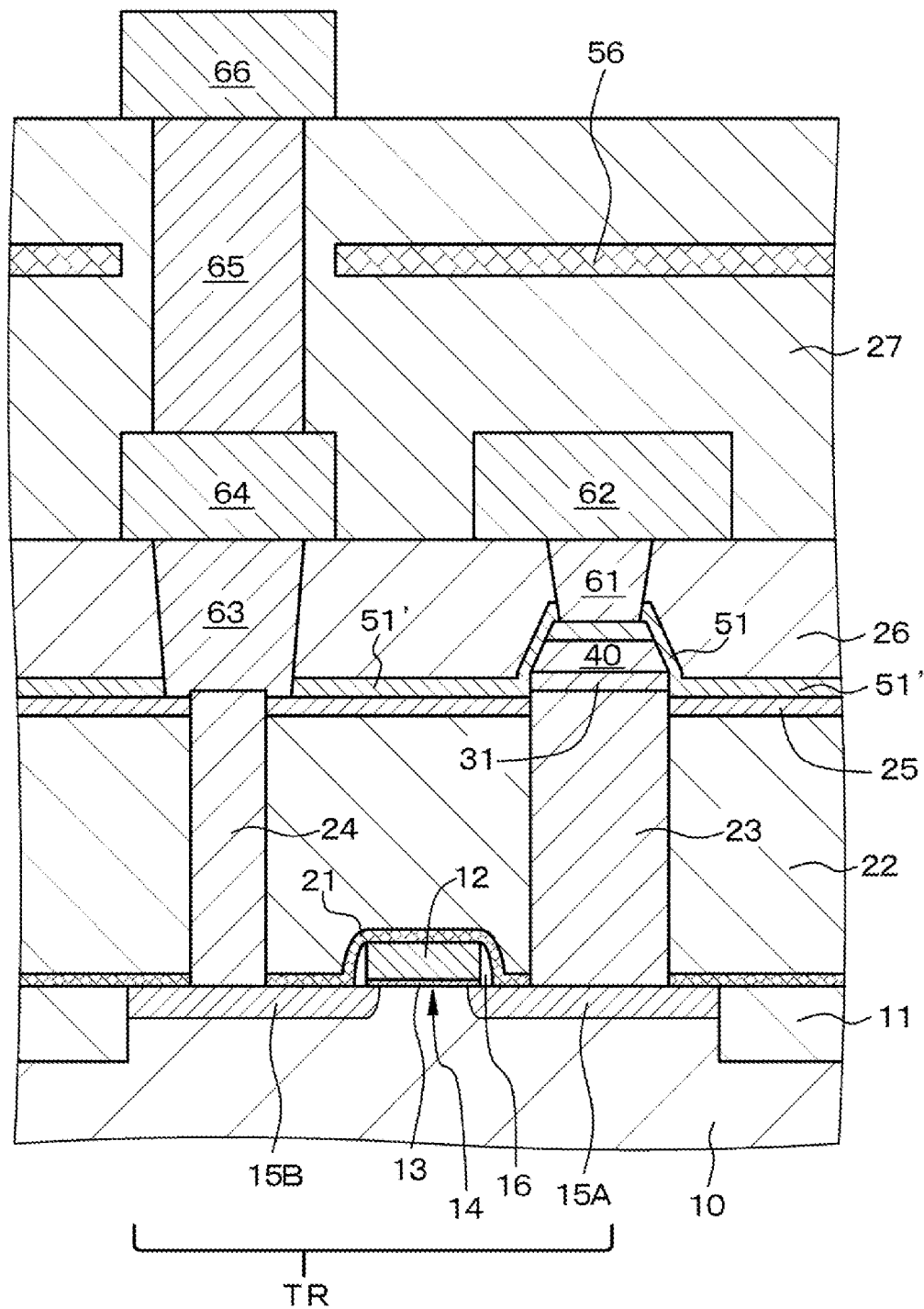
FIG. 18 is a schematic partial cross-sectional diagram of Variation example 5 of the magnetoresistive element of Embodiment 4.
Figure 19:
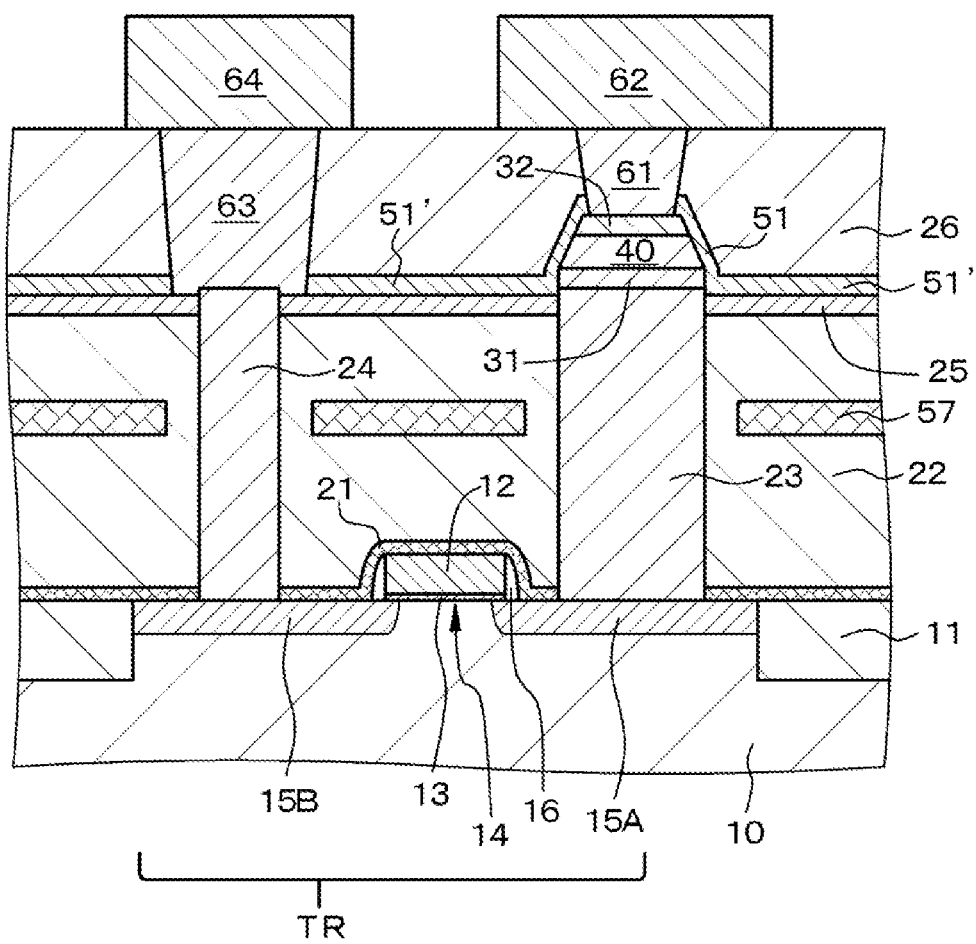
FIG. 19 is a schematic partial cross-sectional diagram of Variation example 6 of the magnetoresistive element of Embodiment 4.
Figure 20:
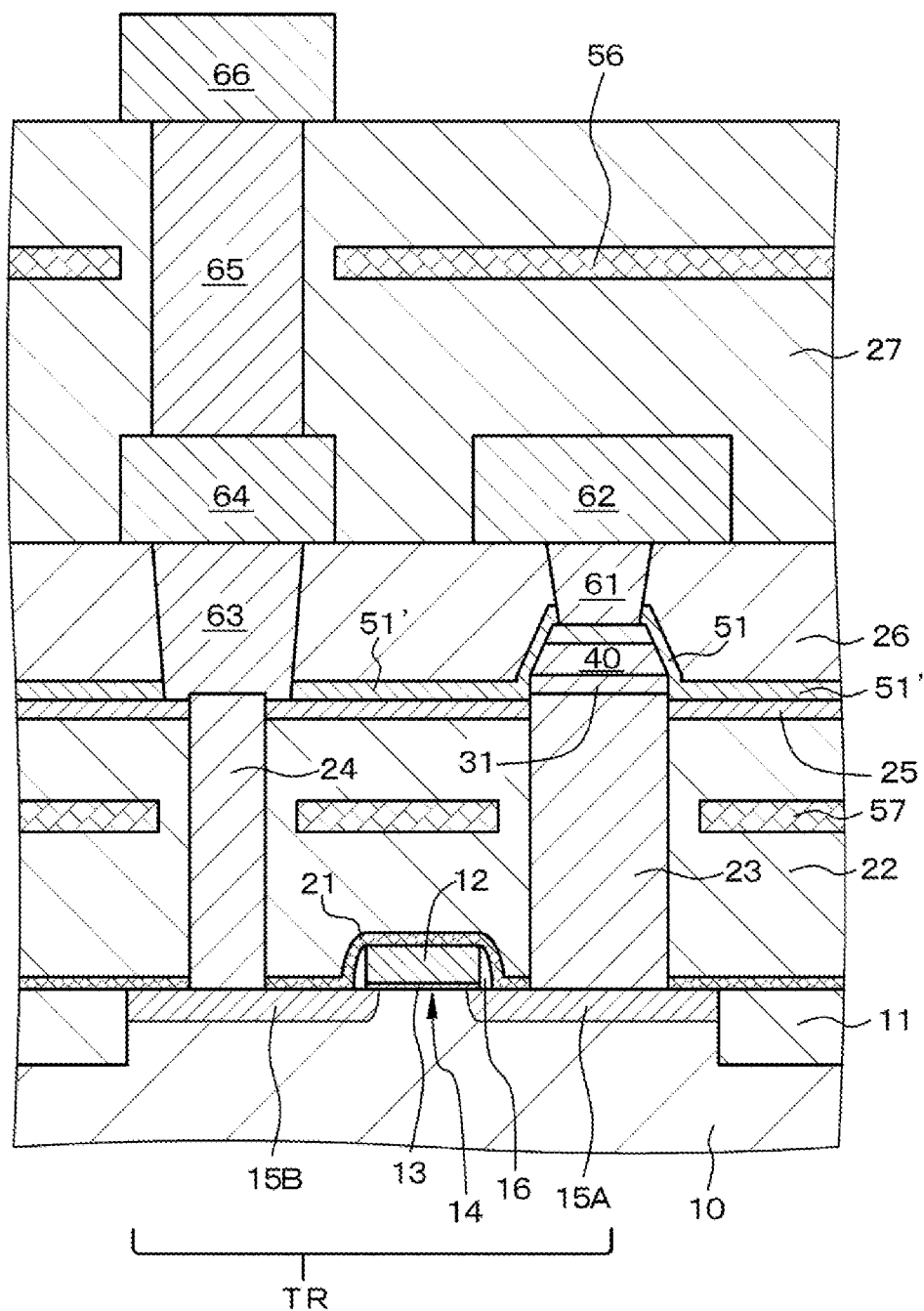
FIG. 20 is a schematic partial cross-sectional diagram of Variation example 7 of the magnetoresistive element of Embodiment 4.
Figure 21:
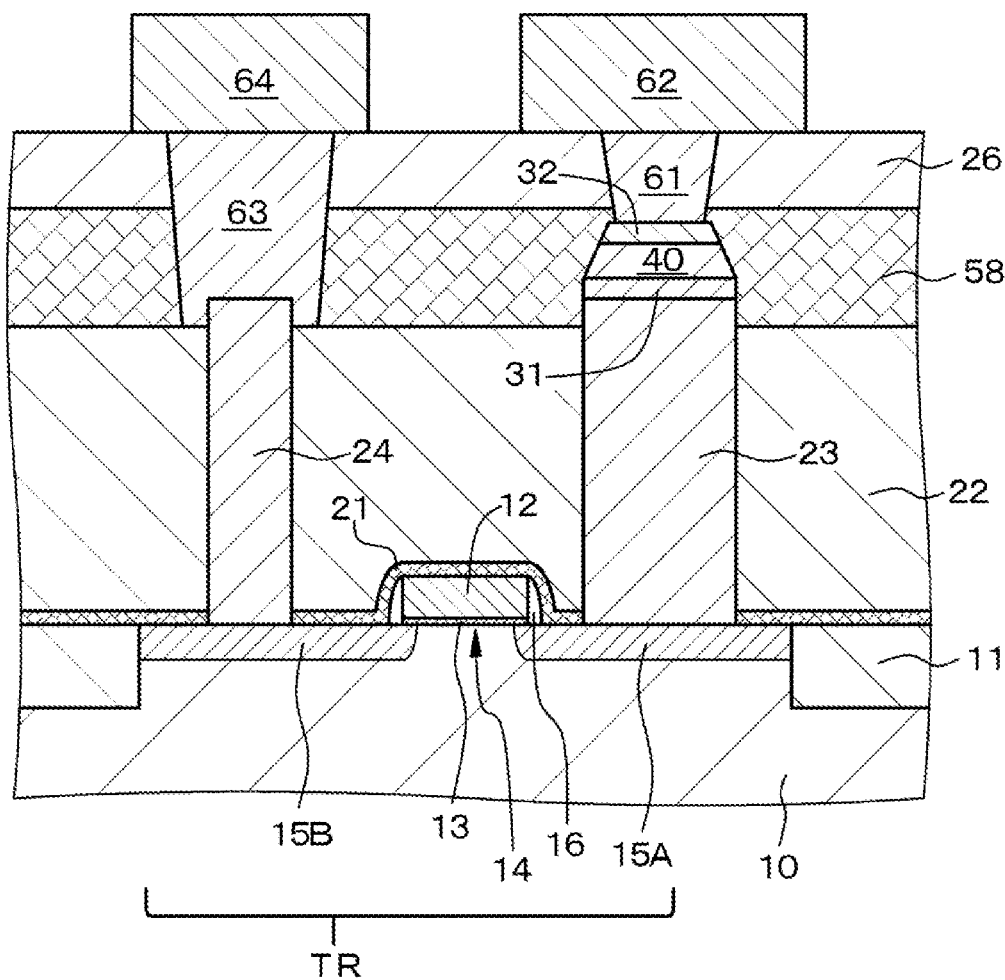
FIG. 21 is a schematic partial cross-sectional diagram of a magnetoresistive element of Embodiment 5.

As illustrated in FIG. 18, Variation example 5 of the magnetoresistive element of Embodiment 4 is a variation, of the magnetoresistive element (see FIG. 13) of Embodiment 4, in which formation of the second side wall is omitted. As illustrated in FIG. 19, Variation example 6 of the magnetoresistive element of Embodiment 4 is a variation, of Variation example 2 (see FIG. 15) of the magnetoresistive element of Embodiment 4, in which formation of the second side wall is omitted. As illustrated in FIG. 20, Variation example 7 of the magnetoresistive element of Embodiment 4 is a variation, of Variation example 4 (see FIG. 17) of the magnetoresistive element of Embodiment 4, in which formation of the second side wall is omitted.

In the magnetoresistive element of Embodiment 4 and variations thereof explained above the upper interlayer film 56 is shared by the plurality of magnetoresistive elements. That is, one or a plurality of upper interlayer films 56 is provided across a plurality of magnetoresistive elements. The lower interlayer film 57 is shared by the plurality of magnetoresistive elements. That is, one or a plurality of lower interlayer films 57 is provided across a plurality of magnetoresistive elements. The thickness of the upper interlayer film 56 or the lower interlayer film 57 is $1\times10^{-8}$ m or larger, preferably $2\times10^{-8}$ m or larger. Specifically, the thickness of the upper interlayer film 56 or the lower interlayer film 57 was set for instance to 50 nm.

Except for the above points, the configuration and structure of the magnetoresistive element of Embodiment 4 can be set to be identical to the configuration and structure of the magnetoresistive elements of Embodiment 1 to Embodiment 3, and thus a detailed explanation thereof will be omitted.

In the magnetoresistive element of Embodiment 4, an upper interlayer film and/or lower interlayer film made of a hydrogen storage material are formed, and hence the multilayer structure of the magnetoresistive element during the process of production is yet less likely to come in contact with hydrogen generated in for instance the insulating layers, and the various layers that make up the multilayer structure of the magnetoresistive element are yet less likely to become reduced. It becomes therefore possible to curtail, yet more reliably, the occurrence of various problems such as degradation of the information retention characteristic and resistance value variability in the magnetoresistive element.

Embodiment 5

Embodiment 5 relates to a magnetoresistive element according to a fourth aspect of the present disclosure, and is a variation of Embodiment 3 and Embodiment 4. As illustrated in the schematic partial cross-sectional diagram of FIG. 21, in the magnetoresistive element of Embodiment 5 the multilayer structure 40 is surrounded by a hydrogen intrusion preventing layer 58 made of an insulating material. The hydrogen intrusion preventing layer 58 is made of SiN or $AlO_X$, but may be made of SiN having a film quality similar to the film quality of the SiN that constitutes the third side wall 53 described above.

The hydrogen intrusion preventing layer 58 is shared by the plurality of magnetoresistive elements. Specifically, one or a plurality of hydrogen intrusion preventing layers 58 is provided across a plurality of magnetoresistive elements. The hydrogen intrusion preventing layer 58 covers the side face of the first electrode 31, and preferably, the top surface of the hydrogen intrusion preventing layer 58 stands higher than the top surface of the second electrode 32, more preferably, the top surface of the hydrogen intrusion preventing layer 58 stands higher than the top surface of the second electrode 32 by $3\times10^{-8}$ m or more.

In such a structure the hydrogen intrusion preventing layer 58 can be formed over the entire surface after etching (see FIG. 6B), by reactive ion etching (RIE), of the second electrode 32, the multilayer structure 40 and the first electrode 31, in a process similar to that of [Step 110] of Embodiment 1.

In the magnetoresistive element of Embodiment 5 the multilayer structure is surrounded by a hydrogen intrusion preventing layer made of an insulating material, and hence the multilayer structure of the magnetoresistive element does not come readily in contact, during the process of production, with hydrogen generated in for instance the insulating layers, and the various layers that make up the multilayer structure of the magnetoresistive element are not prone to being reduced. It becomes therefore possible to reliably curtail the occurrence of various problems such as degradation of the information retention characteristic and resistance value variability in the magnetoresistive element.

Except for the above points, the configuration and structure of the magnetoresistive element of Embodiment 5 can be set to be identical to the configuration and structure of the magnetoresistive elements of Embodiment 3 and Embodiment 4, and thus a detailed explanation thereof will be omitted. The configuration and structure of the magnetoresistive element of Embodiment 5 can be used in the magnetoresistive element of Embodiment 1 and Embodiment 2. That is, the insulating layer 26 may be replaced by hydrogen intrusion preventing layer 58 made of an insulating material.

Embodiment 6

Figure 22A:
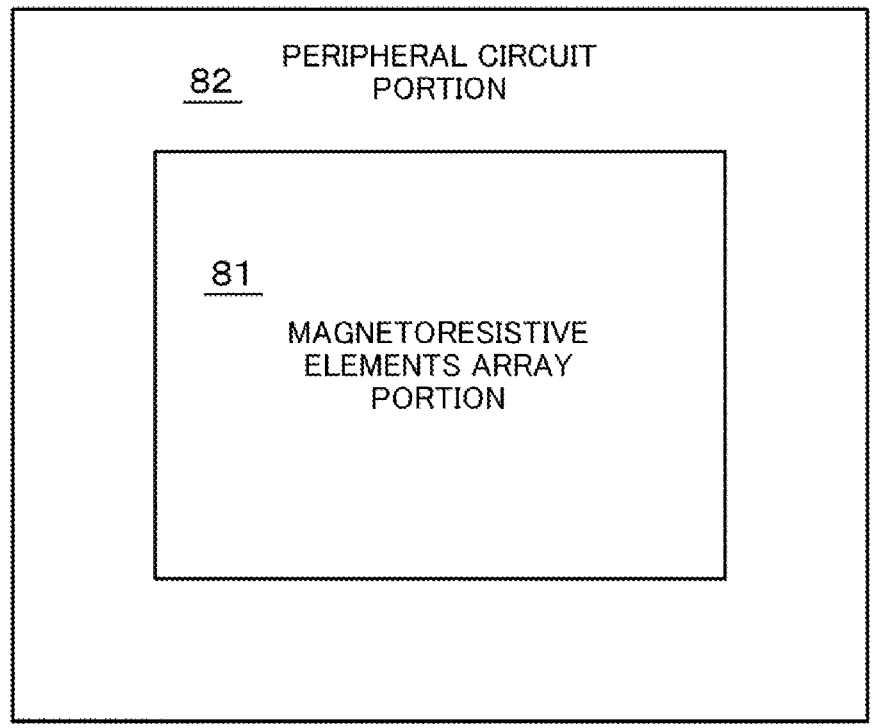
FIG. 22A and FIG. 22B are a planar conceptual diagram and a cross-sectional conceptual diagram of a semiconductor device of Embodiment 6.
Figure 22B:
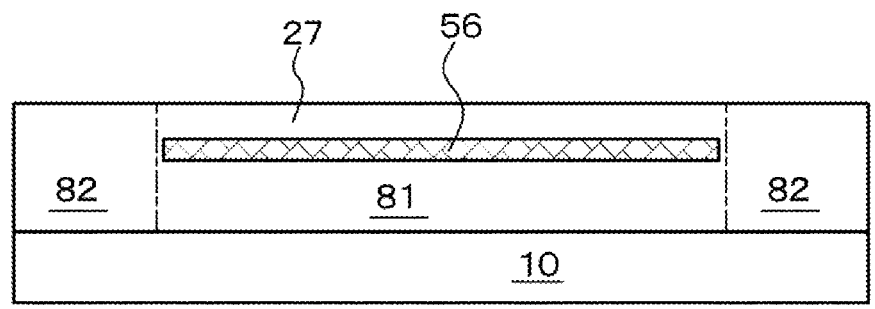

Embodiment 6 relates to a semiconductor device according to a first aspect of the present disclosure. As illustrated in the planar conceptual diagram of FIG. 22A and the cross-sectional conceptual diagram of FIG. 22B, the semiconductor device of Embodiment 6 has magnetoresistive element array portion 81 configured out of magnetoresistive elements and a peripheral circuit portion 82 provided in the periphery of the magnetoresistive element array portion 81. The magnetoresistive elements have the multilayer structure 40 made up of at least a fixed magnetization layer, an intermediate layer and a storage layer. Specifically, the magnetoresistive elements have the configuration and structure explained in Embodiment 1 to Embodiment 4. The magnetoresistive element array portion 81 and the peripheral circuit portion 82 are covered by the upper insulating layer 27 explained in Embodiment 4. The upper interlayer film 56 made of a hydrogen storage material, explained in Embodiment 4, is formed within the upper insulating layer 27 of the magnetoresistive element array portion 81. The upper interlayer film 56 is not formed in the peripheral circuit portion. As explained in Embodiment 4, the upper interlayer film 56 is shared by the plurality of magnetoresistive elements that make up the magnetoresistive element array portion 81. Specifically, one or a plurality of upper interlayer films 56 is provided across a plurality of magnetoresistive elements. Although not limited thereto, the upper interlayer film 56 occupies a surface area that is 50% or more of the surface area of the region taken up by the magnetoresistive element array portion 81, and preferably takes up a surface area that is as large as possible.

Ordinarily a pad portion made up of aluminum having a Ti film as an underlayer is formed in the peripheral circuit portion 82, but if a dummy pad portion (not functioning as a pad portion) made up of aluminum having a Ti film as a underlayer is formed in conjunction with formation of the pad portion, then a base film made of Ti can substitute for the upper interlayer film 56.

The thickness of the Ti film corresponding to the upper interlayer film 56 was set to 60 nm and the surface area taken up by the Ti film in the magnetoresistive element array portion 81 was set to 50%. The obtained semiconductor device (magnetoresistive elements) was annealed for three hours at 400° C. in a nitrogen gas atmosphere; a comparison between the magnetic coercivity of the magnetoresistive elements before and after annealing was 97% (3% drop). Meanwhile, a semiconductor device (magnetoresistive elements) of a comparative example, produced omitting formation of the underlayer made up of a Ti film was annealed for three hours at 400° C. in a nitrogen gas atmosphere; a comparison between the magnetic coercivity of the magnetoresistive elements before and after annealing was 44% (56% drop). This revealed that degradation of the information retention characteristic of the magnetoresistive elements was reliably suppressed in Embodiment 6.

Figure 23A:
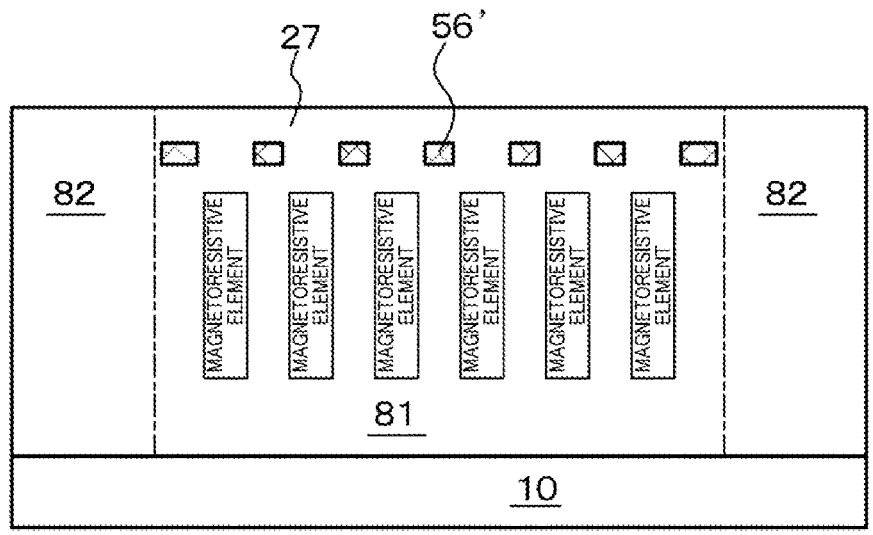
FIG. 23A, FIG. 23B and FIG. 23C are cross-sectional conceptual diagrams of a variation of the semiconductor device of Embodiment 6, and a semiconductor device of Embodiment 7.

In order to achieve the structure of such magnetoresistive element array portion 81, magnetoresistive elements having a configuration and structure explained in Embodiment 1 to Embodiment 4, as described above, may be used as the magnetoresistive elements that make up the magnetoresistive element array portion 81, or magnetoresistive elements according to a fifth aspect of the present disclosure may be used. Specifically, as illustrated in FIG. 23A which is a cross-sectional conceptual diagram of a variation of such a semiconductor device of Embodiment 6, the magnetoresistive elements have the multilayer structure 40 made up of at least a fixed magnetization layer, an intermediate layer and a storage layer, wherein the multilayer structure 40 is covered by the upper insulating layer 27, and the upper interlayer film 56' made of a hydrogen storage material is formed within the region of the upper insulating layer 27 positioned outward of the multilayer structure 40. The multilayer structures 40 are not covered by the upper interlayer film 56', and an orthogonal projection image of the multilayer structures 40 on the semiconductor substrate 10 and an orthogonal projection image of the upper interlayer film 56' on the semiconductor substrate 10 do not overlap each other. A plurality of upper interlayer films 56' is provided in the form of dots (planar shape, for instance a circular or rectangular shape, or any shape) in the magnetoresistive element array portion 81. Alternatively, the upper interlayer film 56' may be provided, in the magnetoresistive element array portion 81, in the form of a solid film in such a manner so as not to overlap the orthogonal projection image of the multilayer structures 40. Alternatively, the upper interlayer film 56' is provided in the magnetoresistive element array portion 81 so as not to come in contact with various elements that make up the magnetoresistive elements. In some cases, the upper interlayer film 56' made of a hydrogen storage material may be formed within the region of the insulating layer 26 positioned outward of the multilayer structures 40.

Figure 23B:
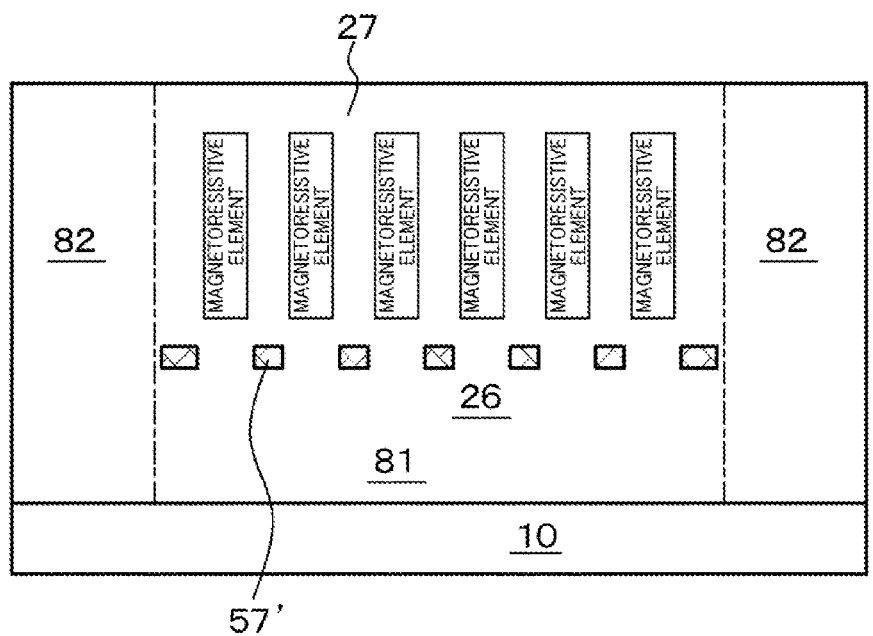

Alternatively, as illustrated in FIG. 23B which is a cross-sectional conceptual diagram of another variation of the semiconductor device of Embodiment 6, the magnetoresistive elements have the multilayer structure 40 made up of at least a fixed magnetization layer, an intermediate layer and a storage layer, wherein the multilayer structures 40 are formed on the insulating layer 26, and a lower interlayer film 57' made of a hydrogen storage material is formed within a region of the insulating layer 26 positioned outward of the multilayer structures 40 (i.e. within a region of the insulating layer 26 positioned outward of the multilayer structures 40, below the multilayer structures 40). Herein an orthogonal projection image of the multilayer structures 40 on the semiconductor substrate 10 and an orthogonal projection image of the lower interlayer film 57' on the semiconductor substrate 10 do not overlap each other. A plurality of lower interlayer films 57' is provided in the form of dots (planar shape, for instance a circular or rectangular shape, or any shape) in the magnetoresistive element array portion 81. Alternatively the lower interlayer film 57' may be provided, in the magnetoresistive element array portion 81, in the form of a solid film so as not to overlap the orthogonal projection image of the multilayer structures 40. Alternatively, the lower interlayer film 57' is provided in the magnetoresistive element array portion 81 so as not to come in contact with various elements that make up the magnetoresistive elements.

The upper interlayer film 56' and the lower interlayer film 57' may be combined with each other.

The upper interlayer film made of a hydrogen storage material is formed in the magnetoresistive elements that make up the magnetoresistive element array portion of the semiconductor device of Embodiment 6; that is, the multilayer structures are covered by the upper interlayer film; alternatively, the upper interlayer film is provided above or on the sides of the multilayer structures, or the lower insulating film; alternatively, a lower insulating film is provided below the multilayer structures. The multilayer structures of the magnetoresistive elements do not come readily in contact, during the process of production, with hydrogen generated in for instance the insulating layers, and the various layers that make up the multilayer structures of the magnetoresistive elements are not prone to being reduced. It becomes therefore possible to reliably curtail the occurrence of various problems such as degradation of the information retention characteristic and resistance value variability in the magnetoresistive elements. The various transistors that make up the peripheral circuit portion in the semiconductor device of Embodiment 6 are not covered by the upper interlayer film, and hence the transistors readily come into contact, during the process of production, with hydrogen generated for instance in the insulating layer. As a result, Si and O dangling bonds can be terminated, higher reliability can be imparted to the transistors, and for instance random telegraph signal (RTS) noise can be reduced.

Figure 22C:
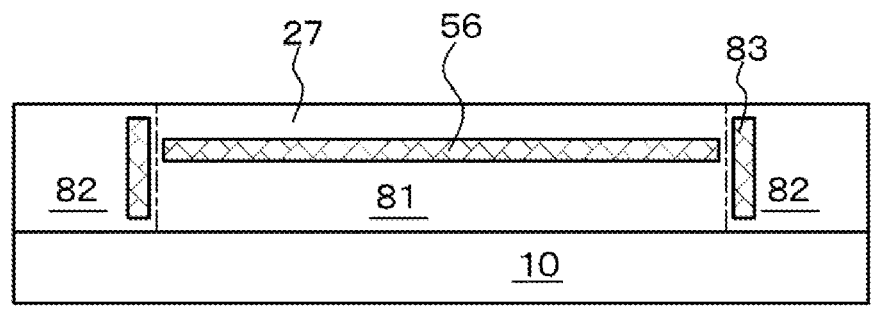
FIG. 22C is a cross-sectional conceptual diagram of a variation of the semiconductor device of Embodiment 6.

Alternatively, as illustrated in the cross-sectional conceptual diagram of FIG. 22C, a form can be adopted where the magnetoresistive element array portion 81 is surrounded by a layer (groove portion or separation groove portion) 83 made of a hydrogen storage material (specifically for instance titanium). Such a layer 83 can be obtained by forming a groove from the upper insulating layer 27 up to the interlayer insulating layer 22, and by filling up the groove with titanium (Ti).

The configuration and structure of the magnetoresistive elements that make up the semiconductor device of Embodiment 6 can be similar to the configuration and structure of the magnetoresistive elements of Embodiment 3 and Embodiment 4; also the configuration and structure of the magnetoresistive elements of Embodiment 1 and Embodiment 2 can be used herein, and hence a detailed explanation will be omitted.

Embodiment 7

Figure 23C:
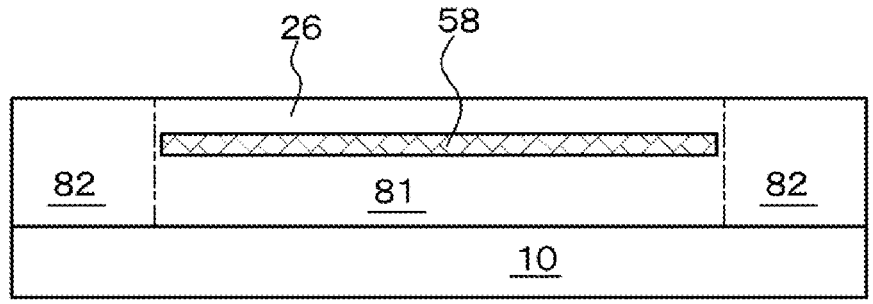

Embodiment 7 relates to a semiconductor device according to a second aspect of the present disclosure. As illustrated in the planar conceptual diagram of FIG. 22A and the cross-sectional conceptual diagram of FIG. 23C, the semiconductor device of Embodiment 7 has magnetoresistive element array portion 81 configured out of magnetoresistive elements and a peripheral circuit portion 82 provided in the periphery of the magnetoresistive element array portion 81, similarly to the semiconductor device of Embodiment 6. The magnetoresistive elements have the multilayer structure 40 made up of at least a fixed magnetization layer, an intermediate layer and a storage layer. Specifically, the magnetoresistive elements have the configuration and structure explained in Embodiment 5. The multilayer structures 40 are surrounded by a hydrogen intrusion preventing layer 58 made of an insulating material and shared by the magnetoresistive elements. The hydrogen intrusion preventing layer 58 has a configuration and structure similar to those explained in Embodiment 5. The hydrogen intrusion preventing layer 58 is formed in the magnetoresistive element array portion 81, but is not formed in the peripheral circuit portion 82. As explained in Embodiment 5, the hydrogen intrusion preventing layer 58 is shared by the plurality of magnetoresistive elements that make up the magnetoresistive element array portion 81. Specifically, one or a plurality of hydrogen intrusion preventing layers 58 is provided across a plurality of magnetoresistive elements.

The hydrogen intrusion preventing layer is formed in the magnetoresistive elements that make up the magnetoresistive element array portion of the semiconductor device of Embodiment 7; specifically, the multilayer structures are surrounded by the hydrogen intrusion preventing layer, and hence the multilayer structures of the magnetoresistive elements do not come readily in contact, during the process of production, with hydrogen generated in for instance the insulating layers, and the various layers that make up the multilayer structures of the magnetoresistive elements are not prone to being reduced. It becomes therefore possible to reliably curtail the occurrence of various problems such as degradation of the information retention characteristic and resistance value variability in the magnetoresistive elements. The various transistors that make up the peripheral circuit portion in the semiconductor device of Embodiment 7 are not covered by the hydrogen intrusion preventing layer, and hence the transistors readily come in contact, during the process of production, with hydrogen generated for instance in the insulating layer. As a result, Si and O dangling bonds can be terminated, higher reliability can be imparted to the transistor, and for instance random telegraph signal (RTS) noise can be reduced.

Embodiment 8

Embodiment 8 relates to an electronic device, specifically a magnetic head, provided with a magnetoresistive element explained in Embodiment 1 to Embodiment 5. The magnetic head can be used in for instance various electronic devices and electric devices such as hard disk drives, integrated circuit chips, personal computers, mobile terminals, cell phones and magnetic sensor devices.

Figure 24A:
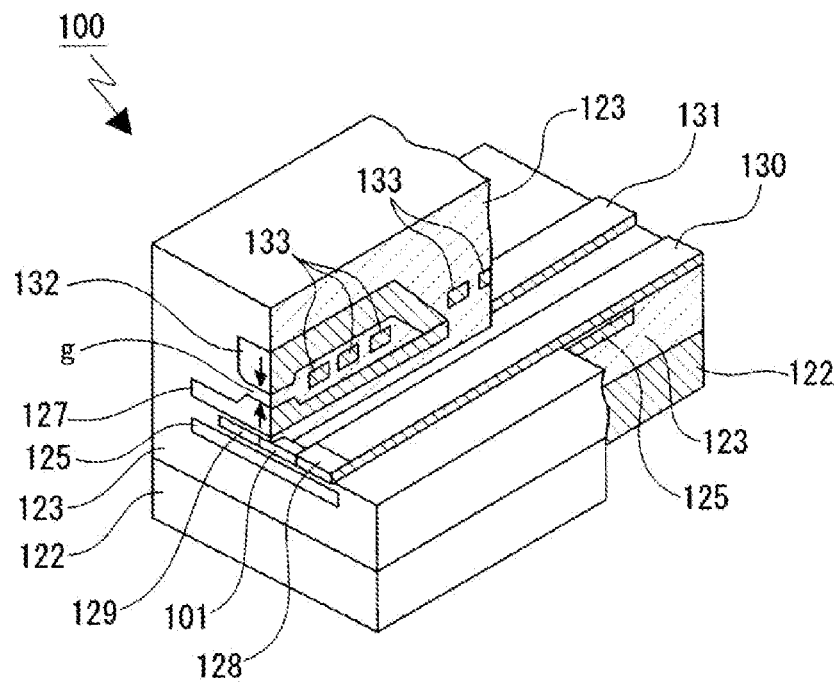
FIG. 24A and FIG. 24B are respectively a schematic perspective-view diagram illustrating a composite-type magnetic head of Embodiment 8, with part thereof cut away, and a schematic cross-sectional diagram of the composite-type magnetic head of Embodiment 8.
Figure 24B:
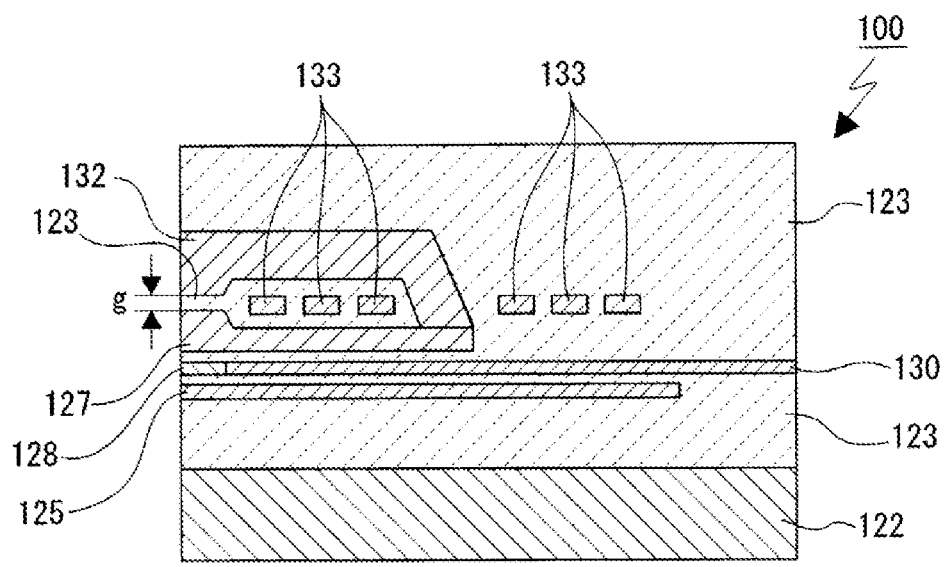

As an example, FIG. 24A and FIG. 24B illustrate instances where a magnetoresistive element 101 is used in a composite-type magnetic head 100. FIG. 24A is a schematic perspective-view diagram illustrating the composite-type magnetic head 100 with a partial cutaway cut out so that the internal structure thereof can be comprehended, and FIG. 24B is a schematic cross-sectional diagram of the composite-type magnetic head 100.

In the composite-type magnetic head 100, which is a magnetic head used for instance in hard disk devices, a magnetoresistive effect-type magnetic head provided with the magnetoresistive element explained in Embodiment 1 to Embodiment 5 is formed on a substrate 122, and an inductive magnetic head is further laid up/formed on the magnetoresistive effect-type magnetic head. The magnetoresistive effect-type magnetic head operates as a reproducing head, and the inductive magnetic head operations as a recording head. That is, the composite-type magnetic head 100 combines a reproducing head and a recording head.

The magnetoresistive effect-type magnetic head mounted on the composite-type magnetic head 100 is a so-called shield-type MR head, provided with: a first magnetic shield layer 125 formed on the substrate 122 across an insulating layer 123, magnetoresistive element 101 formed on the first magnetic shield layer 125 across an insulating layer 123, and a second magnetic shield layer 127 formed on the magnetoresistive element 101 across an insulating layer 123. The insulating layer 123 is made of an insulating material such as $Al_2O_3$ or $SiO_2$. The first magnetic shield layer 125, the purpose whereof is to magnetically shield the lower layer side of the magnetoresistive element 101, is made of a soft magnetic material such as Ni—Fe. The magnetoresistive element 101 is formed on the first magnetic shield layer 125 across the insulating layer 123. In the magnetoresistive effect-type magnetic head, the magnetoresistive element 101 functions as a magnetoresistive elements that detects a magnetic signal from a magnetic recording medium. The shape of the magnetoresistive element 101 is substantially rectangular, and has one side face thereof exposed as a face that opposes the magnetic recording medium. Bias layers 128, 129 are disposed on either side of the magnetoresistive element 101. Connection terminals 130, 131 connected to the bias layers 128, 129 are also formed. A sense current is supplied to the magnetoresistive element 101 via the connection terminals 130, 131. The second magnetic shield layer 127 is provided above the top of the bias layers 128, 129, across the insulating layer 123.

The inductive magnetic head laid up/formed on the magnetoresistive effect-type magnetic head is provided with a magnetic core made up of the second magnetic shield layer 127 and an upper core 132, and thin-film coils 133 formed so as to wind around the magnetic core. The upper core 132, which forms a closed magnetic path together with the second magnetic shield layer 127 and constitutes a magnetic core of the inductive magnetic head, is made of a soft magnetic material such as Ni—Fe. The second magnetic shield layer 127 and the upper core 132 are formed so that the front ends thereof are exposed as surfaces that face the magnetic recording medium, and so that the second magnetic shield layer 127 and the upper core 132 are in contact with each other at the rear ends. The front ends of the second magnetic shield layer 127 and the upper core 132 are formed so that the second magnetic shield layer 127 and the upper core 132 are spaced apart from each other by a predetermined gap g, at the surface facing the magnetic recording medium. That is, in the composite-type magnetic head 100 the second magnetic shield layer 127 not only magnetically shields the upper layer side of the magnetoresistive element 101, but also serves concurrently as the magnetic core of the inductive magnetic head; the magnetic core of the inductive magnetic head is thus made up of the second magnetic shield layer 127 and the upper core 132. The gap g is a recording magnetic gap of the inductive magnetic head.

Thin-film coils 133 embedded in the insulating layer 123 are further formed on the second magnetic shield layer 127. The thin-film coils 133 are formed so as to wind around the magnetic core made up of the second magnetic shield layer 127 and the upper core 132. Although not illustrated in the figures, both ends of each thin-film coil 133 are exposed to the exterior, with terminals formed at both ends of each thin-film coil 133 serving as external connection terminals of the inductive magnetic head. To record a magnetic signal on the magnetic recording medium, a recording current is supplied to the thin-film coils 133 from these external connection terminals.

A magnetoresistive effect-type magnetic head is mounted, as a reproducing head, in the composite-type magnetic head 100 such as the one above. The magnetoresistive effect-type magnetic head is provided with the magnetoresistive element 101 explained in Embodiment 1 to Embodiment 5, as a magnetoresistive element for detecting a magnetic signal from a magnetic recording medium. The magnetoresistive element 101 exhibits very good characteristics, as described above, and hence the magnetoresistive effect-type magnetic head can cope with yet higher recording densities of magnetic recording.

Although the present disclosure has been described above based on preferred embodiments, the disclosure is not limited to these embodiments. The various multilayer structures, materials used and so forth explained in the embodiments can be modified as appropriate. The fixed magnetization layer can be configured in the form of a multilayer ferrimagnetic structure (multilayer ferrimagnetic pinned structure) made up of a reference layer and a fixed layer. A substrate having formed thereon a logic region that includes a non-volatile storage element array configured out of a plurality of magnetoresistive elements of the present disclosure, and for instance a substrate including an imaging element array having formed thereon a plurality of imaging elements, can be bonded to each other.

A layer made of a hydrogen storage material (specifically titanium, Ti) may be formed on a side wall of an opening. In a case where a pad portion is provided, a layer made of a hydrogen storage material (specifically titanium, Ti) may be formed on the lower face and/or top face of the portion. The number of wiring layers is not limited to one, and may be two or more.

A memory cell unit of so-called cross-point type can be configured out of a plurality of magnetoresistive elements (storage elements, non-volatile memory cells). Such a memory cell unit of cross-point type is configured out of a plurality of third wirings (word lines) extending in a first direction; a plurality of second wirings (bit lines) disposed spaced apart from the third wirings in the vertical direction, and extending in a second direction different from that of the third wirings; and magnetoresistive elements (storage elements, non-volatile memory cells) disposed in the regions overlapping the third wirings and the second wirings, and connected to the third wirings and the second wirings. Information is written on or deleted from the magnetoresistive elements depending on the orientation of the voltage that is applied across the third wirings and the second wirings, or the orientation of current flowing across the third wirings and the second wirings. The selection transistor TR is not necessary in such a structure.

The present invention can adopt configurations such as those below.

[A01] <<Magnetoresistive Element: First Aspect>>

A magnetoresistive element, including:
a multilayer structure made up of at least a fixed magnetization layer, an intermediate layer and a storage layer; wherein
a first side wall is formed on a side wall of the multilayer structure;
a second side wall is formed on the first side wall;
the first side wall is made of an insulating material that prevents intrusion of hydrogen; and
the second side wall is made of a hydrogen storage material.

[A02] The magnetoresistive element of [A01] wherein the second side wall is made of titanium.

[A03] The magnetoresistive element of [A01] or [A02], wherein the thickness of the second side wall is $3 \times 10^{-8}$ m or larger.

[A04] The magnetoresistive element of any one of [A01] to [A03], wherein the first side wall is made of SiN or $AlO_X$.

[A05] The magnetoresistive element of any one of [A01] to [A04], wherein the thickness of the first side wall is $1 \times 10^{-8}$ m or larger.

[A06] The magnetoresistive element of any one of [A01] to [A05], wherein a third side wall made of an insulating material that prevents intrusion of hydrogen is formed on the second side wall.

[A07] The magnetoresistive element of [A06] wherein the third side wall is made of SiN or $AlO_X$.

[A08] The magnetoresistive element of any one of [A01] to [A07], wherein the multilayer structure further has an upper hydrogen storage layer thereon or thereabove; and
the first side wall covers a side wall of the upper hydrogen storage layer.

[A09] The magnetoresistive element of any one of [A01] to [A08], wherein the multilayer structure further has a lower hydrogen storage layer thereunder or therebelow; and
the first side wall covers a side wall of the lower hydrogen storage layer.

[A10] The magnetoresistive element of any one of [A01] to [A09],
which is covered by an upper insulating layer; wherein
an upper interlayer film made of a hydrogen storage material is formed within the upper insulating layer.

[A11] The magnetoresistive element of [A10], wherein the upper interlayer film occupies a surface area that is 50% or more of the surface area taken up by the magnetoresistive element.

[A12] The magnetoresistive element of any one of [A01] to [A11], wherein the multilayer structure is formed on an interlayer insulating layer; and a lower interlayer film made of a hydrogen storage material is formed within the interlayer insulating layer.

[A13] The magnetoresistive element of [A12], wherein the lower interlayer film occupies a surface area that is 50% or more of the surface area taken up by the magnetoresistive element.

[A14] <<Magnetoresistive Element: Second Aspect>>
A magnetoresistive element, including:
a multilayer structure made up of at least a fixed magnetization layer, an
intermediate layer and a storage layer; wherein
the multilayer structure further has an upper hydrogen storage layer thereon or thereabove.

[A15] The magnetoresistive element of [A14], wherein the multilayer structure further has a lower hydrogen storage layer thereunder or therebelow.

[A16] <<Magnetoresistive Element: Third Aspect>>
A magnetoresistive element, including:
a multilayer structure made up of at least a fixed magnetization layer, an intermediate layer and a storage layer; wherein
the multilayer structure further has a lower hydrogen storage layer thereunder or therebelow.

[A17] <<Magnetoresistive Element: Fourth Aspect>>
A magnetoresistive element, including:
a multilayer structure made up of at least a fixed magnetization layer, an intermediate layer and a storage layer; wherein
the multilayer structure is surrounded by a hydrogen intrusion preventing layer made of an insulating material.

[A18] The magnetoresistive element of [A17], wherein the hydrogen intrusion preventing layer is made of SiN or $AlO_X$.

[A19] <<Magnetoresistive Element: Fifth Aspect>>
A magnetoresistive element, including:
a multilayer structure made up of at least a fixed magnetization layer, an intermediate layer and a storage layer; wherein
the multilayer structure is covered by an upper insulating layer; and
an upper interlayer film made of a hydrogen storage material is formed within a region of the upper insulating layer positioned outward of the multilayer structure.

[A20] The magnetoresistive element of [A19], wherein the upper interlayer film occupies a surface area that is 50% or more of the surface area taken up by the magnetoresistive element.

[A21] <<Magnetoresistive Element: Sixth Aspect>>
A magnetoresistive element, including:
a multilayer structure made up of at least a fixed magnetization layer, an intermediate layer and a storage layer; wherein
the multilayer structure is formed on an insulating layer; and
a lower interlayer film made of a hydrogen storage material is formed within a region of the insulating layer positioned outward of the multilayer structure.

[A22] The magnetoresistive element of [A21] wherein the Lower Interlayer Film occupies a surface area that is 50% or more of the surface area taken up by the magnetoresistive element.

[B01] <<Semiconductor Device: First Aspect>>
A semiconductor device provided with a magnetoresistive element array portion made up of a magnetoresistive element, and a peripheral circuit portion, wherein
the magnetoresistive element has a multilayer structure made up of at least a fixed magnetization layer, an intermediate layer and a storage layer;
the magnetoresistive element array portion and the peripheral circuit portion are covered by an upper insulating layer;
an upper interlayer film made of a hydrogen storage material is formed within the upper insulating layer in the magnetoresistive element array portion; and the upper interlayer film is not formed in the peripheral circuit portion.

[B02] The semiconductor device of [B01], wherein the magnetoresistive element array portion is surrounded by a layer made of a hydrogen storage material.

[B03] The semiconductor device of [B01] or [B02], wherein the upper interlayer film occupies a surface area that is 50% or more of the surface area taken up by the magnetoresistive element array portion.

[B04]<<Semiconductor Device: Second Aspect>>
A semiconductor device provided with a magnetoresistive element array portion made up of a magnetoresistive element, and a peripheral circuit portion, wherein the magnetoresistive element has a multilayer structure made up of at least a fixed magnetization layer, an intermediate layer and a storage layer; and the multilayer structure is surrounded by a hydrogen intrusion preventing layer that is made of an insulating material and is shared by magnetoresistive elements.

[B05] The semiconductor device of [B04], wherein the hydrogen intrusion preventing layer is made of SiN or $AlO_X$.

[B06] The semiconductor device of [B04] or [B05], wherein a hydrogen intrusion preventing layer is formed in the magnetoresistive element array portion; and a hydrogen intrusion preventing layer is not formed in the peripheral circuit portion.

[B07] The semiconductor device of any one of [B01] to [B06], wherein the magnetoresistive element is made up of the magnetoresistive element of any one of [A01] to [A22].

REFERENCE SIGNS LIST

10 Semiconductor substrate
11 Element separation region
12 Gate electrode (word line or address line)
13 Gate insulating layer
14 Channel formation region
15A, 15B Source/drain region
16 Gate side wall
21 Lower insulating film
22 Interlayer insulating layer
23, 24 Connection hole
23', 24', 65' Insulating material layer
25 Upper insulating film
26 Insulating layer
27 Upper insulating layer
31 First electrode
32 Second electrode
40 Multilayer structure
51 First side wall
52 Second side wall
53 Third side wall
54 Upper hydrogen storage layer
55 Lower hydrogen storage layer
56, 56' Upper interlayer film
57, 57' Lower interlayer film
58 Hydrogen intrusion preventing layer
61, 63, 65 Connection hole
61A, 63A, 65A Opening
62 Second wiring (bit line)
64 First wiring (sense line)
62', 64' Underlayer
66 Wiring layer
70 Base material layer
81 Magnetoresistive element array portion
82 Peripheral circuit portion
83 Layer (groove portion) made of a hydrogen storage material
100 Composite-type magnetic head
101 Magnetoresistive element
122 Substrate
123 Insulating layer
125 First magnetic shield layer
127 Second magnetic shield layer
128, 129 Bias layer
130, 131 Connection terminal
132 Upper core
133 Thin-film coil
TR Selection transistor

What is claimed is:

1. A magnetoresistive element, comprising: a multilayer structure made up of at least a fixed magnetization layer, an intermediate layer and a storage layer; a first side wall formed on a side wall of the multilayer structure, wherein the first side wall is made of an insulating material that prevents intrusion of hydrogen, and wherein an inclination angle of the first side wall is in a range of 45 degrees to 60 degrees; and a second side wall formed on the first side wall, wherein the second side wall is made of a hydrogen storage material.

2. The magnetoresistive element of claim 1, wherein the second side wall is made of titanium.

3. The magnetoresistive element of claim 1, wherein a thickness of the second side wall is $3 \times 10^{-8}$ m or larger.

4. The magnetoresistive element of claim 1, wherein the first side wall is made of SiN or $AlO_X$.

5. The magnetoresistive element of claim 1, wherein a thickness of the first side wall is $1 \times 10^{-8}$ m or larger.

6. The magnetoresistive element of claim 1, wherein a third side wall made of the insulating material that prevents intrusion of hydrogen is formed on the second side wall.

7. The magnetoresistive element of claim 6, wherein the third side wall is made of SiN or $AlO_X$.

8. The magnetoresistive element of claim 1, wherein the multilayer structure further has an upper hydrogen storage layer thereon or thereabove, and wherein the first side wall covers a side wall of the upper hydrogen storage layer.

9. The magnetoresistive element of claim 1, wherein the multilayer structure further has a lower hydrogen storage layer thereunder or therebelow, and wherein the first side wall covers a side wall of the lower hydrogen storage layer.

10. The magnetoresistive element of claim 1, wherein the multilayer structure is covered by an upper insulating layer, and wherein an upper interlayer film made of the hydrogen storage material is formed within the upper insulating layer.

11. The magnetoresistive element of claim 1, wherein the multilayer structure is formed on an interlayer insulating layer, and wherein a lower interlayer film made of the hydrogen storage material is formed within the interlayer insulating layer.

* * * * *